United States Patent
Li et al.

(10) Patent No.: US 12,396,212 B2
(45) Date of Patent: Aug. 19, 2025

(54) GATE ALL-AROUND DEVICE WITH THROUGH-STACK NANOSHEET 2D CHANNEL

(71) Applicant: International Business Machines Corporation, Armonk, NY (US)

(72) Inventors: Tao Li, Slingerlands, NY (US); Ardasheir Rahman, Schenectady, NY (US); Tsung-Sheng Kang, Ballston Lake, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 585 days.

(21) Appl. No.: 17/545,574

(22) Filed: Dec. 8, 2021

(65) Prior Publication Data

US 2023/0178623 A1 Jun. 8, 2023

(51) Int. Cl.
*H10D 30/67* (2025.01)
*H10D 30/01* (2025.01)
*H10D 62/10* (2025.01)

(52) U.S. Cl.
CPC ....... *H10D 30/6735* (2025.01); *H10D 30/031* (2025.01); *H10D 30/6713* (2025.01); *H10D 30/6729* (2025.01); *H10D 30/6757* (2025.01); *H10D 62/118* (2025.01)

(58) Field of Classification Search
CPC ........... H01L 29/42392; H01L 29/0665; H01L 29/41733; H01L 29/66742; H01L 29/78696; H01L 29/0676; H01L 29/0673
USPC ........................................................ 257/288
See application file for complete search history.

(56) References Cited

U.S. PATENT DOCUMENTS

| | | | |
|---|---|---|---|
| 7,012,304 | B1 | 3/2006 | Dabral et al. |
| 8,309,405 | B2 | 11/2012 | Yang et al. |
| 9,391,176 | B2 | 7/2016 | Flachowsky et al. |
| 9,418,911 | B2 | 8/2016 | Shim et al. |
| 9,947,586 | B2 | 4/2018 | Basker et al. |
| 10,243,061 | B1 | 3/2019 | Cheng et al. |
| 10,249,739 | B2 | 4/2019 | Guillorn et al. |

(Continued)

FOREIGN PATENT DOCUMENTS

| | | |
|---|---|---|
| CN | 101248505 B | 12/2010 |
| CN | 103633099 B | 9/2016 |

OTHER PUBLICATIONS

Ng et al., "Ultra-high aspect ratio trenches in single crystal silicon with epitaxial gap tuning," Transducers & Eurosensors XXVII: The 17th International Conference on Solid-State Sensors, Actuators and Microsystems, Jun. 2013, pp. 182-185.

(Continued)

*Primary Examiner* — Fernando L Toledo
*Assistant Examiner* — Laura M Dykes
(74) *Attorney, Agent, or Firm* — Scully, Scott, Murphy & Presser, P.C.; Samuel Waldbaum

(57) ABSTRACT

A semiconductor channel material structure is provided that has an improved, i.e., increased, effective channel area. The semiconductor channel material structure includes a plurality of semiconductor channel material nanosheets stacked one atop the other. The increased channel area is afforded by providing at least one through-stack semiconductor channel material that extends through at least one of the semiconductor channel material nanosheets.

12 Claims, 36 Drawing Sheets

(56) References Cited

U.S. PATENT DOCUMENTS

| | | | |
|---|---|---|---|
| 10,388,569 | B1 | 8/2019 | Cheng et al. |
| 2007/0228461 | A1 | 10/2007 | Cho |
| 2017/0365661 | A1* | 12/2017 | Doris .................... H01L 29/778 |
| 2019/0189446 | A1 | 6/2019 | Xu et al. |
| 2019/0326286 | A1 | 10/2019 | Xie et al. |
| 2020/0273979 | A1 | 8/2020 | Xie et al. |
| 2020/0274000 | A1 | 8/2020 | Xie et al. |
| 2020/0343361 | A1 | 10/2020 | Cheng |
| 2020/0411513 | A1* | 12/2020 | Jambunathan ...... H01L 27/0924 |
| 2021/0193844 | A1* | 6/2021 | Ramaswamy ...... H01L 29/7847 |
| 2022/0139911 | A1* | 5/2022 | Wei .................. H01L 29/78696 |
| | | | 257/365 |

OTHER PUBLICATIONS

Geumjong Bae et al., "3nm GAA technology featuring multi-bridge-channel FET for low power and high performance applications," International Electron Devices Meeting (IEDM), Dec. 2018, 28.7, 4 pp.

Haass, M., "Pulsed plasmas for etch applications", Thesis, May 3, 2013, 182 pages.

Dixit, P., et al., "Via Technologies for MEMS", Handbook of Silicon Based MEMS Materials and Technologies, 2015, pp. 694-712.

International Search Report dated Nov. 30, 2022, received in a corresponding foreign application, 9 pages.

* cited by examiner

GATE ALL-AROUND DEVICE WITH THROUGH-STACK NANOSHEET 2D CHANNEL

BACKGROUND

The present application relates to semiconductor technology, and more particularly to a semiconductor structure including a semiconductor channel material structure having an increased effective channel area.

The use of non-planar semiconductor devices is the next step in the evolution of complementary metal oxide semiconductor (CMOS) devices. One type of non-planar semiconductor device that has been touted as a viable option beyond the 7 nm technology node is a nanosheet device. In typical nanosheet devices, one or more suspended semiconductor channel material nanosheets are stacked one over the other, and a functional gate structure is formed in a wrap-around manner on the one or more suspended semiconductor channel material nanosheets. Such nanosheet devices are referred to as gate all-around devices. In conventional gate all-around devices, the effective channel area is limited by the stacked nature of the semiconductor channel material nanosheets. There is a need for providing a semiconductor structure in which the effective channel area of the nanosheet stack is improved.

SUMMARY

A semiconductor channel material structure (i.e., a through-stack nanosheet 2D channel) is provided that has an improved, i.e., increased, effective channel area. The semiconductor channel material structure includes a plurality of semiconductor channel material nanosheets stacked one atop the other. The increased channel area is afforded by providing at least one through-stack semiconductor channel material that extends through at least one of the semiconductor channel material nanosheets. The term "extending though" denotes that one material travels through a bottommost surface and a topmost surface of another material/structure such that the extending portions adds a protruding element to the another/material/structure. The at least one through-stack semiconductor channel material provides a vertical component to the otherwise horizontally oriented semiconductor channel material nanosheets.

In one aspect of the present application, a semiconductor structure is provided. In one embodiment, the semiconductor structure includes a semiconductor channel material structure containing a plurality of semiconductor channel material nanosheets stacked one atop the other and at least one through-stack semiconductor channel material extending through at least one of the semiconductor channel material nanosheets of the plurality of semiconductor channel material nanosheets.

In another aspect of the present application, a method of forming a semiconductor structure is provided. In one embodiment, the method includes forming a material stack of alternating semiconductor channel material layers and sacrificial semiconductor material layers on a semiconductor substrate, wherein the material stack includes least one through-stack semiconductor channel material that passes through at least one of the semiconductor channel material layers of the material stack. The material stack containing the at least one through-stack semiconductor channel material is then patterned to provide a patterned material stack containing the at least one through-stack semiconductor channel material. The patterned material stack containing the at least one through-stack semiconductor channel material is then converted into a nanosheet stack containing alternating sacrificial semiconductor material nanosheets and semiconductor channel material nanosheets, wherein at least of the semiconductor channel material nanosheets contains the at least one through-stack semiconductor channel material. Next, each sacrificial semiconductor channel material nanosheet is removed.

DETAILED DESCRIPTION

Figure 1A:
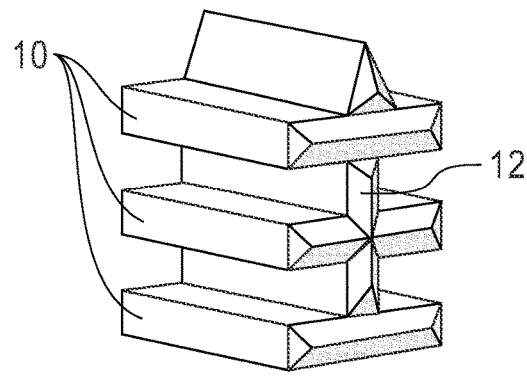
FIGS. 1A, 1B and 1C are three-dimension (3D) illustrations of various semiconductor channel material structures in accordance with one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a semiconductor channel material structure such as is shown, for example, in FIGS. 1A, 1B, 1C, 2A, 2B, 3A, and 3B that includes a plurality of semiconductor channel material nanosheets 10 stacked one atop the other and at least one through-stack semiconductor channel material 12 extending through at least one of the semiconductor channel material nanosheets 10 of the plurality of semiconductor channel material nanosheets. In the remaining drawings, namely FIGS. 4-27C, the semiconductor channel material nanosheets are labeled as element "22", while the through-stack semiconductor channel material is labeled as element "34". Due to the presence of the through-stack semiconductor channel material, the semiconductor channel material structures of the present application have an increased effective channel area as compared to a conventional stacked nanosheet structure.

Each semiconductor channel material nanosheet 10 of the plurality of semiconductor channel material nanosheets is oriented parallel to each other. In embodiments, the at least one through-stack semiconductor channel material 12 is oriented perpendicular (i.e., 90°) to each of the semiconductor channel material nanosheets 10 of the plurality of semiconductor channel material nanosheets. In other embodiments, there can be a slight tilt (i.e., ±10 from 90°) to the through-stack semiconductor channel material 12 relative a planar surface of the semiconductor channel material nanosheets 10.

Figure 1B:
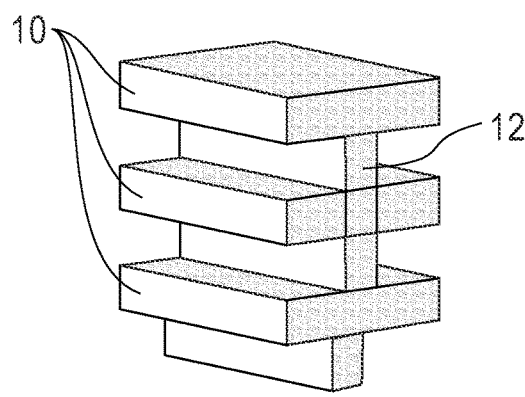
Figure 1C:
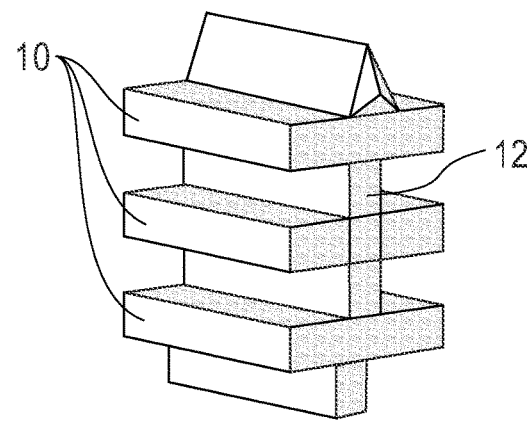

In some embodiments, the least one through-stack semiconductor channel material 12 extends entirely through each of the semiconductor channel material nanosheets 10 of the plurality of semiconductor channel material nanosheets (see, for example, FIGS. 1A and 1C). In FIG. 1B, the least one through-stack semiconductor channel material 12 does not extending entirely through the topmost semiconductor channel material nanosheet 10. In some embodiments, the at least through-stack semiconductor channel material 12 extends through a topmost semiconductor channel material nanosheet of the plurality of semiconductor channel material nanosheets, but not a bottommost semiconductor channel material nanosheet of the plurality of semiconductor channel material nanosheets. In such an embodiment, the at least through-stack semiconductor channel material 12 that extends through a topmost semiconductor channel material nanosheet of the plurality of semiconductor channel material nanosheets can have a pyramidal shape (See, for example, FIGS. 1A and 1C). Although the present application described and illustrated a pyramid shape for the end portion of the through-stack semiconductor channel material 12, the present application is not limited to the same.

In some embodiments, the at least through-stack semiconductor channel material 12 extends through a bottommost semiconductor channel material nanosheet of the plurality of semiconductor channel material nanosheets, but not a topmost semiconductor channel material nanosheet of the plurality of semiconductor channel material nanosheets, or vice versa as described above.

Figure 2A:
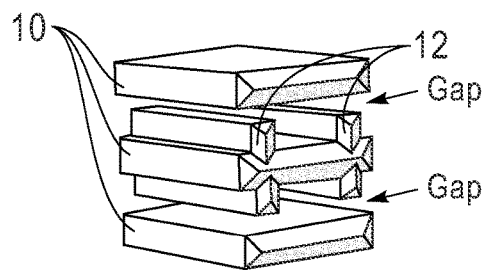
FIGS. 2A and 2B are three-dimension (3D) illustrations of various semiconductor channel material structures in accordance with another embodiment of the present application.
Figure 2B:
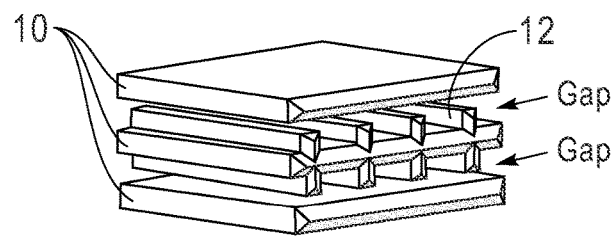

In some embodiments, the at least one through-stack semiconductor channel material 12 comprises a plurality of through-stack semiconductor channel materials 12 extending through at least one of the semiconductor channel material nanosheets 10 (see, for example, the middle one illustrated in FIGS. 2A and 2B) of the stack of semiconductor material nanosheets. In some embodiments and as illustrated in FIGS. 2A and 2B, the plurality of through-stack semiconductor channel materials 12 extend through only a single semiconductor channel material nanosheet 10 of the stack of semiconductor material nanosheets. In such an embodiment, this single semiconductor channel material in which the plurality of through-stack semiconductor channel material extends through can be located between an upper semiconductor channel material nanosheet of the stack of semiconductor material nanosheets and a lower semiconductor channel material nanosheet of the stack of semiconductor material nanosheets. In the embodiments shown in FIGS. 2A and 2B, a gap is present between the single semiconductor channel material nanosheet 10 containing the plurality of through-stack semiconductor channel materials 12 and both the upper semiconductor channel material nanosheet and the lower semiconductor channel material nanosheet. In some embodiments, the gap can be present between the single semiconductor channel material nanosheet 10 containing the plurality of through-stack semiconductor channel materials 12 and either the upper semiconductor channel material nanosheet or the lower semiconductor channel material nanosheet. These gaps, which are not present in other semiconductor channel material structures of the present application, allow for a continuous functional gate structure to present in each gap and can provide a semiconductor channel material structure for a short channel nanosheet device (see, for example, the semiconductor channel material structure shown in FIG. 2A) or a long channel nanosheet device (see, for example, the semiconductor structure shown in FIG. 2B). The term "short channel device" is used throughout the present application to denote a device having a channel length of less than 80 nm, while the term "long channel device" is used throughout the present application to denote a device having a channel length of 80 nm or greater.

Figure 3A:
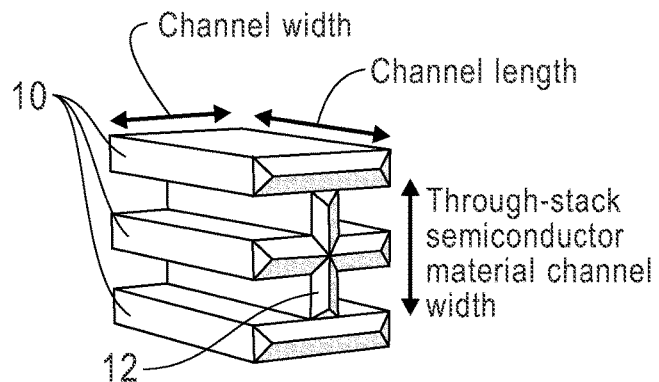
FIGS. 3A and 3B are three-dimension (3D) illustrations of various semiconductor channel material structures in accordance with yet another embodiment of the present application.
Figure 3B:
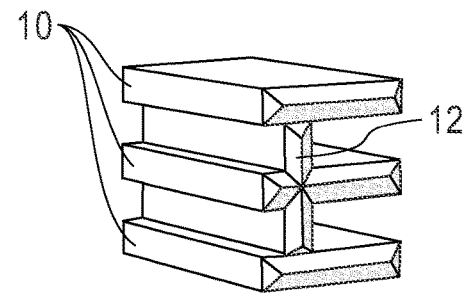

In some embodiments, and as is illustrated in FIGS. 3A and 3B, the at least one through-stack semiconductor channel material 12 has a same channel length as the plurality of semiconductor channel material nanosheets 10, and the at least one through-stack semiconductor channel material 12 has a channel width that is equal to a distance between each semiconductor channel material nanosheet 10 of the plurality of semiconductor channel material nanosheets. In some embodiments, and as is shown in FIG. 3A, the at least one through-stack semiconductor channel material 12 is located at a center of a channel width of the at least one of the semiconductor channel material nanosheets 10 of the plurality of semiconductor channel material nanosheets, while in other embodiments and is illustrated in FIG. 3B, the at least one through-stack semiconductor channel material 12 is offset from a center of a channel width of the at least one of the semiconductor channel material nanosheets 10 of the plurality of semiconductor channel material nanosheets.

In embodiments, the at least one through-stack semiconductor channel material 12 is composed of a semiconductor material that is compositionally the same as a semiconductor material that provides each of the semiconductor channel material nanosheet 10 of the plurality of semiconductor channel material nanosheets. In such an embodiment, which is depicted for example in each of the semiconductor channel material structures shown in FIGS. 1A-3B, there is no material interface between the at least one through-stack semiconductor channel material 12 and the at least one semiconductor channel material nanosheet 10 in which the at least one through-stack semiconductor channel material 12 passes through. In yet other embodiments, the at least one through-stack semiconductor channel material 12 is composed of a semiconductor material that is compositionally different from a semiconductor material that provides each of the semiconductor channel material nanosheet 10 of the plurality of semiconductor channel material nanosheets. The term "semiconductor material" is used throughout the present application to denote a material that has semiconductor properties. Illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, or an II/VI compound semiconductor. In embodiments, the semiconductor channel material nanosheets 10 and the least one through-stack semiconductor channel material 12 can be composed of a semiconductor material that is capable of providing high channel mobility for n-type nanosheet devices. In other embodiments, the semiconductor channel material nanosheets 10 and the least one through-stack semiconductor channel material 12 can be composed of a semiconductor material that is capable of providing high channel mobility for p-type nanosheet devices.

Each semiconductor channel material nanosheet 10 can have a width from 15 nm to 85 nm, a length equal to 8 nm, and a height from 5 nm to 10 nm. Other widths, lengths and heights for the semiconductor channel material nanosheets 10 can be used in the present application as well. In the present application, a functional gate structure is formed on physically exposed surfaces of the semiconductor channel material structures shown for example in FIGS. 1A-3B; this aspect of the present application will become more apparent by processing details to follow. The term "functional gate structure" is used throughout the present application to denote an active gate structure which includes at least a gate dielectric material and a gate electrode.

Reference will now be made to FIGS. 4-16C, which illustrate processing steps that can be used in providing a semiconductor structure in accordance with the present application including a functional gate structure formed on physically exposed surfaces of a semiconductor channel material structure in accordance with an embodiment of the present application. In this embodiment, the semiconductor channel material structure that will be formed is the one shown in FIG. 1C. Modifications to the processing can be made to provide the semiconductor channel material structures shown in FIGS. 1A and 1B.

Figure 4:
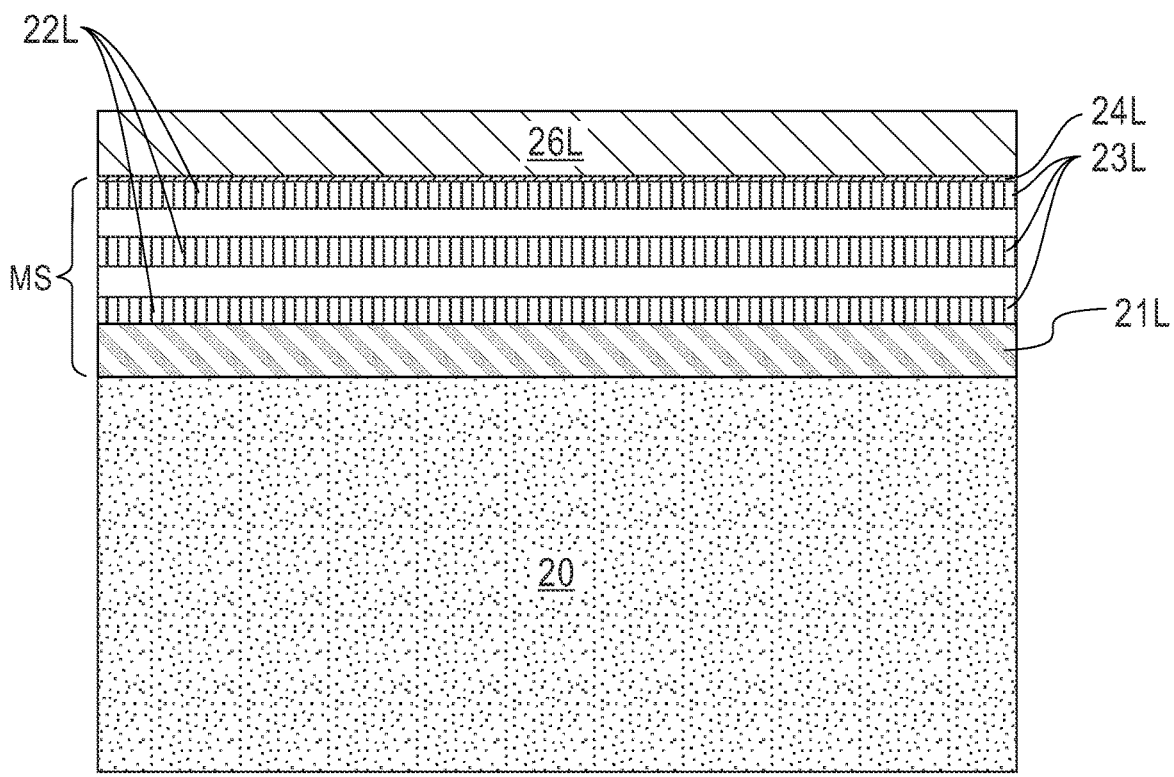
FIG. 4 is a cross sectional view of an exemplary structure that can be employed in accordance with an embodiment of the present application, the exemplary structure including a semiconductor substrate, a material stack of alternating sacrificial semiconductor material layers and semiconductor channel material layers, and a first pad oxide layer, and a first hard mask layer.

Referring first to FIG. 4, there is illustrated an exemplary structure that can be employed in accordance with an embodiment of the present application. The exemplary structure illustrated in FIG. 4 includes a semiconductor substrate 20, a material stack MS of alternating sacrificial semiconductor material layers 21L, 23L and semiconductor channel material layers 22L, and a first pad oxide layer 24L, and a first hard mask layer 26L. In the present application, the bottommost sacrificial semiconductor layer 21L of the material stack MS is used as a placeholder material layer and will be replaced by a bottom dielectric material layer. Thus, the bottommost sacrificial material layer 21L of the material stack MS is composed of a semiconductor material that is compositionally different from the semiconductor material that provides the other sacrificial semiconductor material layers 23L in the material stack MS and compositionally different from the semiconductor material that provides each semiconductor channel material layer 22L. This aspect of the present application will be discussed in greater detail hereinbelow.

Also, and in embodiments of the present application, the bottommost semiconductor channel material layer 22L can be thinner than the remaining semiconductor channel material layers 22L in the material stack MS such that during the formation of the bottom dielectric material layer the bottommost semiconductor channel material layer 22L can also be removed from the structure (this aspect of the present application will be described in greater detail hereinbelow).

Semiconductor substrate 20 can be composed of a semiconductor material as defined above or a multilayered stack including at least two semiconductor materials (e.g., a multilayered stack of Si and SiGe). In one embodiment (depicted in the drawings of the present application), the semiconductor substrate 20 is entirely composed of at least one semiconductor material. In such an embodiment, the semiconductor substrate 20 can be referred to as a bulk semiconductor substrate. In other embodiments (not shown in the drawings of the present application), semiconductor substrate 20 can be composed of a first semiconductor material layer, a buried insulator layer such as for example, silicon dioxide and/or boron nitride, and a top semiconductor material layer. In such an embodiment, the semiconductor substrate can be referred to as a semiconductor-on-insulator substrate.

Each sacrificial semiconductor material layer 23L, other than the bottommost sacrificial semiconductor material layer 21L, is composed of a first semiconductor material, while each semiconductor channel material layer 22L is composed of a second semiconductor material that is compositionally different from the first semiconductor material. The bottommost sacrificial semiconductor material layer is composed of a third semiconductor material that is compositionally different from both the first semiconductor material and the second semiconductor material. In one example, the third semiconductor material that provides the bottommost sacrificial semiconductor material layer 21L is a silicon germanium alloy having a germanium content of 60 atomic percent, the first semiconductor material that provides the remaining sacrificial semiconductor material layers 23L in the material stack MS is a silicon germanium alloy having a germanium content of 25 atomic percent, and the second semiconductor material that provides each semiconductor channel material layer 22L is silicon.

In some embodiments, the second semiconductor material that provides each semiconductor channel material layer 22L is a semiconductor material that is capable of providing high channel mobility for n-type nanosheet devices. In other embodiments, the second semiconductor material that provides each semiconductor channel material layer 22L is a semiconductor material that is capable of providing high channel mobility for p-type nanosheet devices. It is noted that the third semiconductor material that provides the bottommost sacrificial semiconductor material layer 21L is compositionally different from at least an uppermost semiconductor material portion of the semiconductor substrate 20.

The various semiconductor material layers that provide the material stack MS can be formed utilizing an epitaxial growth process. The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The first pad oxide layer 24L is composed of a dielectric oxide such as, for example silicon dioxide. The first pad oxide layer 24L can be formed by a deposition process including, but not limited to, chemical vapor deposition (CVD), plasma enhanced chemical vapor deposition (PECVD), physical vapor deposition (PVD) or atomic layer deposition (ALD). Alternatively, a thermal oxidation process can be used in forming the first pad oxide layer 24L. The first pad oxide layer 24L typically has a thickness from 5 nm to 50 nm; although other thicknesses for the first pad oxide layer 24L are contemplated and can be used in the present application as the thickness of the first pad oxide layer 24L. In some embodiments, the first pad oxide layer 24L can be omitted.

The first hard mask layer 26L is composed of a dielectric hard mask material that is typically compositionally different from the dielectric oxide that provides the first pad oxide layer 24L. Illustrative examples of hard mask materials that can be employed in the present application in providing the first hard mask layer 26L include, but are not limited to, silicon nitride, silicon oxynitride or silicon dioxide. The first hard mask layer 26L can be formed by a deposition process such as, for example, CVD, PECVD, PVD or ALD. The first hard mask layer 26L typically has a thickness from 10 nm to 100 nm; although other thicknesses for the first hard mask layer 26L are contemplated and can be used in the present application as the thickness of the first hard mask layer 26L.

Figure 5:
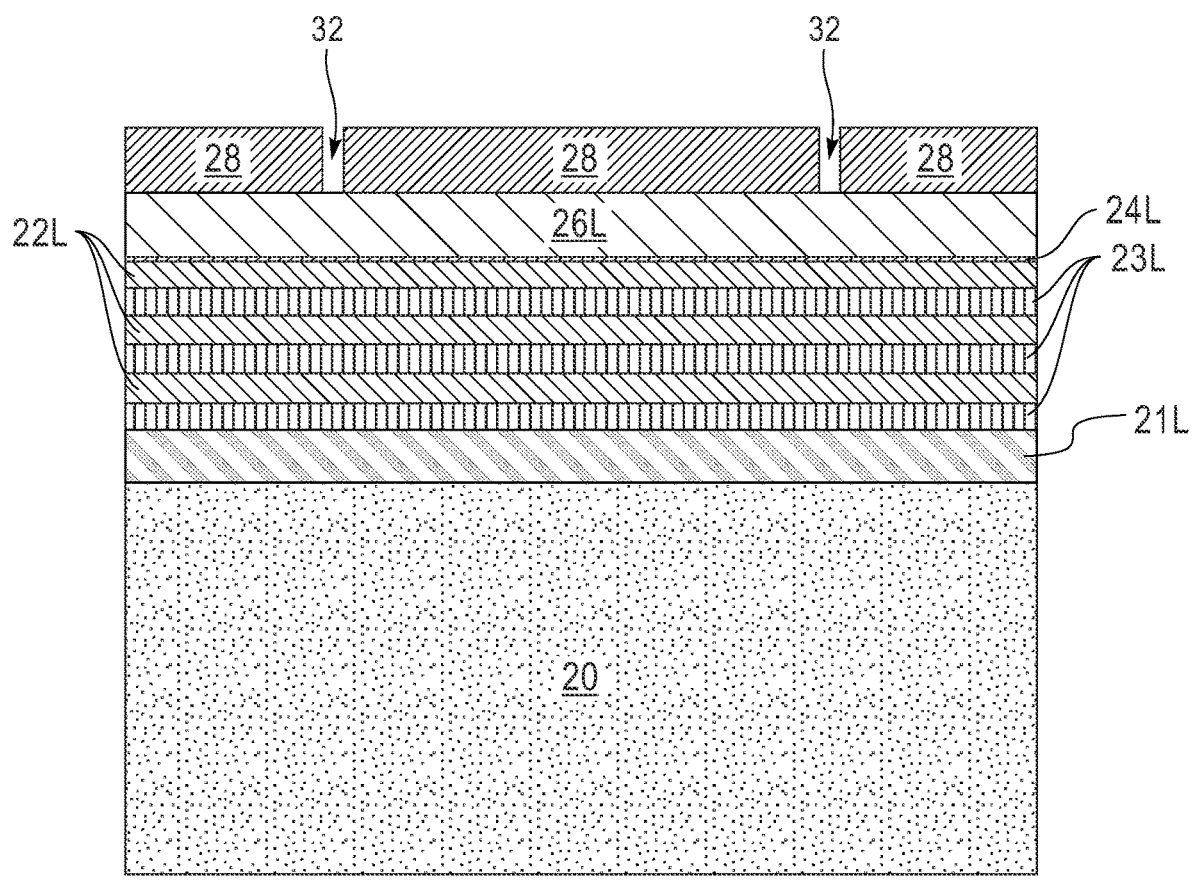
FIG. 5 is a cross sectional view of the exemplary structure shown in FIG. 4 after forming a patterned lithographic stack having at least one trench opening on the first hard mask layer.

Referring now to FIG. 5, there is illustrated the exemplary structure shown in FIG. 4 after forming a patterned lithographic stack 28 having at least one trench opening 30 (two trench openings 30 are depicted by way of one example of the number of trench openings 30 that can be formed) on the first hard mask layer 26L. The patterned lithographic stack 28 includes any conventional lithographic stack that is well known to those skilled in the art. Such lithographic stacks include a photoresist material that can be patterned by exposing the photoresist material to a desired pattern of irradiation and then developing the exposed photoresist material utilizing a conventional resist developer. The at least one trench opening 30 typically has a width from 0.5 nm to 15 nm; other widths are possible can be employed in the present application.

Figure 6:
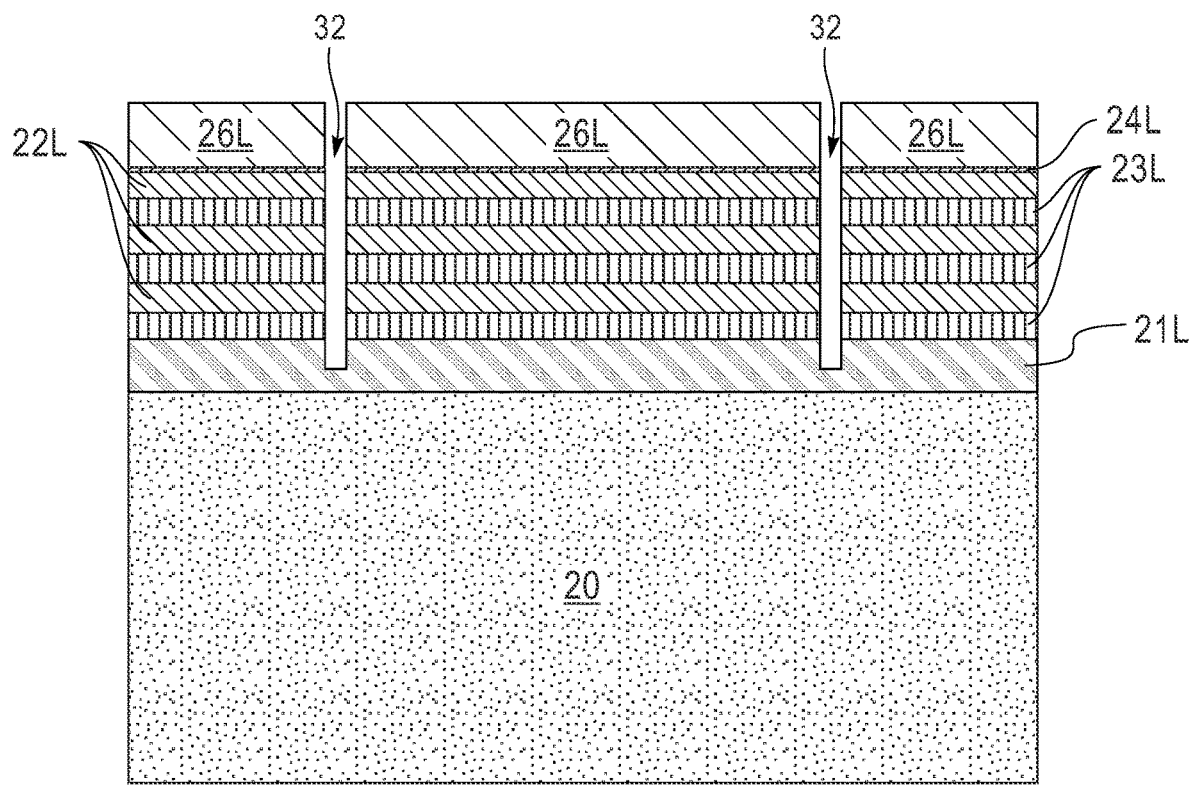
FIG. 6 is a cross sectional view of the exemplary structure shown in FIG. 5 after transferring the at least one trench opening into the first hard mask layer, the first pad oxide layer, and the material stack to provide at least one through-stack trench opening in the exemplary structure, and removing the patterned lithographic stack.

Referring now to FIG. 6, there is illustrated the exemplary structure shown in FIG. 5 after transferring the at least one trench opening 30 into the first hard mask layer 26L, the first pad oxide layer 24L, and the material stack MS to provide at least one through-stack trench opening 32 in the exemplary structure, and removing the patterned lithographic stack 28. The transferring includes an etching process that stops at a surface of one of the sacrificial semiconductor material layers 21L, 23L within the material. In the illustrated embodiment for this example, the etch stop within a sub-surface of the bottommost sacrificial semiconductor material layer 21L. The etching process used to transfer the at least one trench opening 30 can include a dry etching process such as, for example, reactive ion etching (RIE), a chemical wet etching process, or any combination thereof. The at least one through-stack trench opening 32 that is formed must pass through at least one of the semiconductor channel material layers 22L of the material stack MS. In the illustrated embodiment, the at least one through-stack trench opening 32 passes through all of the semiconductor channel material layers 22L of the material stack MS. The at least one through-stack trench opening 32 has substantially the same width (within ±10%) as the at least one trench opening 30. The patterned lithographic stack 28 can be removed after the at least one trench opening 30 is at least transferred into the first hard mask layer 26L. In some embodiments, the patterned lithographic stack 28 is removed after completion of the transferring process. The patterned lithographic stack 28 can be removed utilizing any conventional resist removal process including, for example, ashing.

Although the present application describes and illustrates a lithography process to provide the at least one through-stack semiconductor channel trench 32, the at least one through-stack semiconductor channel trench 32 can be formed utilizing other patterning processes such as, for example, a sidewall image transfer (SIT) process or a direct-assembly (DSA) patterning process.

Figure 7:
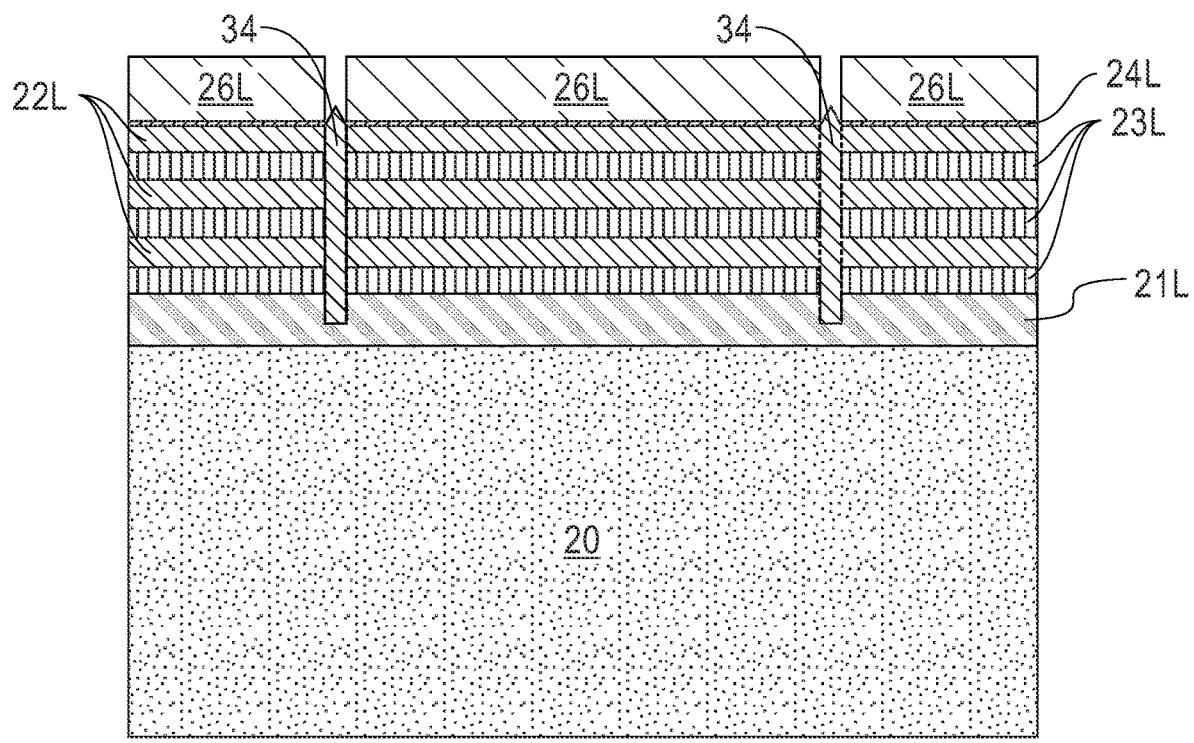
FIG. 7 is a cross sectional view of the exemplary structure shown in FIG. 6 after epitaxially growing a semiconductor channel material in the at least one through-stack semiconductor channel trench to provide a through-stack semiconductor channel material that passes through each of the semiconductor channel material layers.

Referring now to FIG. 7, there is illustrated the exemplary structure shown in FIG. 6 after epitaxially growing a semiconductor channel material in the at least one through-stack semiconductor channel trench 32 to provide a through-stack semiconductor channel material 34 that passes through each of the semiconductor channel material layers 22L of the material stack MS. In other embodiments, the through-stack semiconductor channel material 34 can pass through only some, but not all, (for example, one) of the semiconductor channel material layers 22L. In embodiments, the semiconductor channel material that provides the through-stack semiconductor channel material 34 can be compositionally the same as the second semiconductor material that provides each semiconductor channel material layer 22L. In such embodiments, no material interface is located between the through-stack semiconductor channel material 34 and the semiconductor channel material layers 22L. In embodiments, the semiconductor channel material that provides the through-stack semiconductor channel material 34 can be compositionally different from the second semiconductor material that provides each semiconductor channel material layer. In such embodiments, a material interface is located between the through-stack semiconductor channel material 34 and the semiconductor channel material layers 22L. In FIG. 7, a dotted line is shown to represent a material interface that can exist between the through-stack semiconductor channel material 34 and the semiconductor channel material layers 22L. In the present application, the semiconductor channel material that provides the through-stack semiconductor channel material 34 is compositionally different from the sacrificial semiconductor material layers 21L, 23L of the material stack MS.

The semiconductor channel material that provides the through-stack semiconductor channel material 34 can be grown utilizing an anisotropic epitaxial growth process or an isotropic epitaxial growth process. An anisotropic epitaxial growth process provides a through-stack semiconductor channel material 34 that has an end portion that has a planar surface. An isotropic epitaxial growth process provides a through-stack semiconductor channel material 34 that has an end portion that is pyramidal in shape. FIG. 7 illustrates an embodiment in which the through-stack semiconductor channel material 34 has a pyramidal end portion that extends above the topmost surface of the uppermost semiconductor channel material layer 22L.

Although the present application describes and illustrates forming the at least one through-stack semiconductor channel trench 32 and the through-stack semiconductor channel material 34 in a previously formed material stack, the present application also contemplates embodiments in which after at least one stack (in some embodiments after every stack) of a semiconductor channel material layer 22L and a sacrificial semiconductor layer 23L is formed, a portion of a through-stack semiconductor channel trench 32 is formed and then a portion of the through-stack semiconductor channel material 34 is formed into the previously formed portion of the through-stack semiconductor channel trench 32. Alignment between the individual portions of the through-stack semiconductor channel trench 32 and semiconductor channel material 34 is not important as long as they belong to the same nanosheet stack in the final semiconductor channel material structure.

Figure 8:
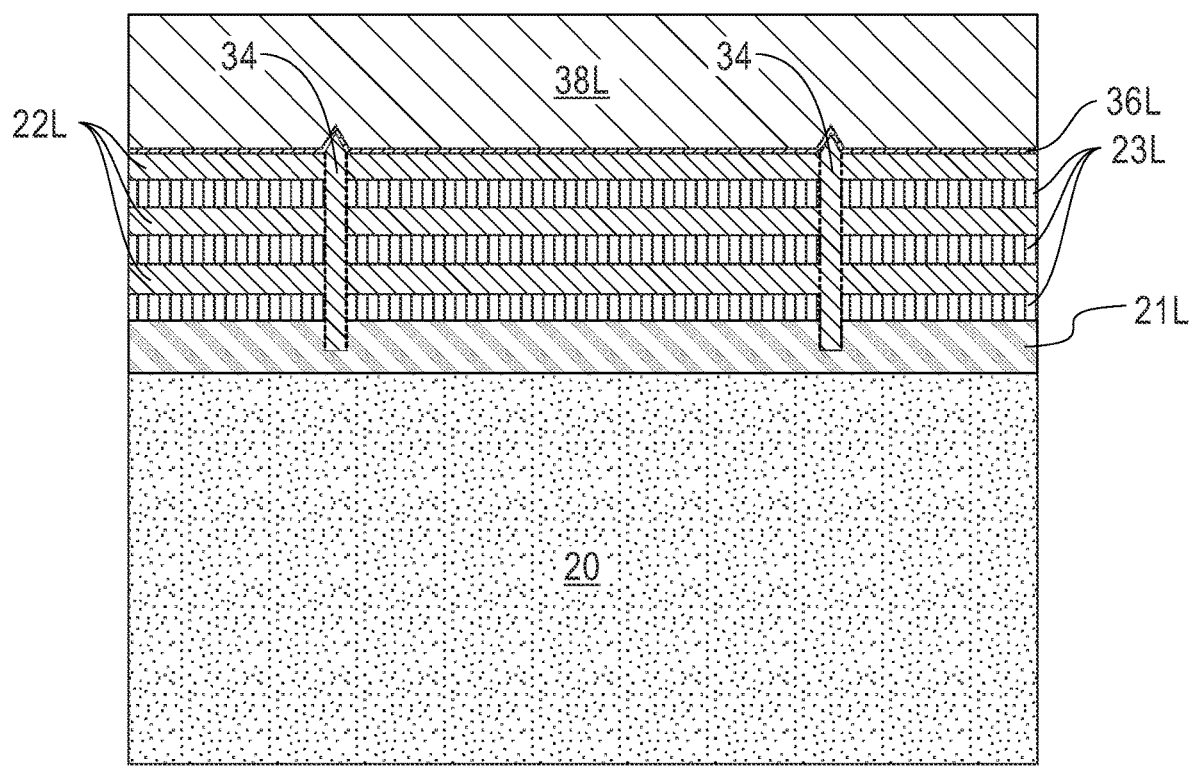
FIG. 8 is a cross sectional view of the exemplary structure shown in FIG. 7 after removing the first hard mask layer and the first pad oxide layer, and forming a second pad oxide layer and a second hard mask layer.

Referring now to FIG. 8, there is illustrated the exemplary structure shown in FIG. 7 after removing the first hard mask layer 26L and the first pad oxide layer 24L, and forming a second pad oxide layer 36L and a second hard mask layer 38L. The first hard mask layer 26L and the first pad oxide layer 24L can be removed utilizing one or more material removal processes that is(are) selective in removing the first hard mask layer 26L and the first pad oxide layer 24L. Typically, a first material removal process is used to remove the first hard mask layer 26L, and a second material removal process is used to remove the first pad oxide layer 24L.

The second pad oxide layer 36L can include one of the dielectric oxides mentioned above for the first pad oxide layer 24L. The second pad oxide layer 36L is formed utilizing one of the deposition processes mentioned above in forming the first pad oxide layer 24L. Alternatively, a thermal oxide process can be used to form the second pad oxide layer 36L. In some embodiments, the second pad oxide layer 36L can be omitted. The second pad oxide layer 36L can have a thickness in the range mentioned above for the first pad oxide layer 24L.

The second hard mask layer 38L can include one of the dielectric hard mask materials mentioned above for the first hard mask layer 26L. The second hard mask layer 38L is formed utilizing one of the deposition processes mentioned above in forming the first hard mask layer 26L. The second hard mask layer 38L can have a thickness in the range mentioned above for the first hard mask layer 26L.

Figure 9:
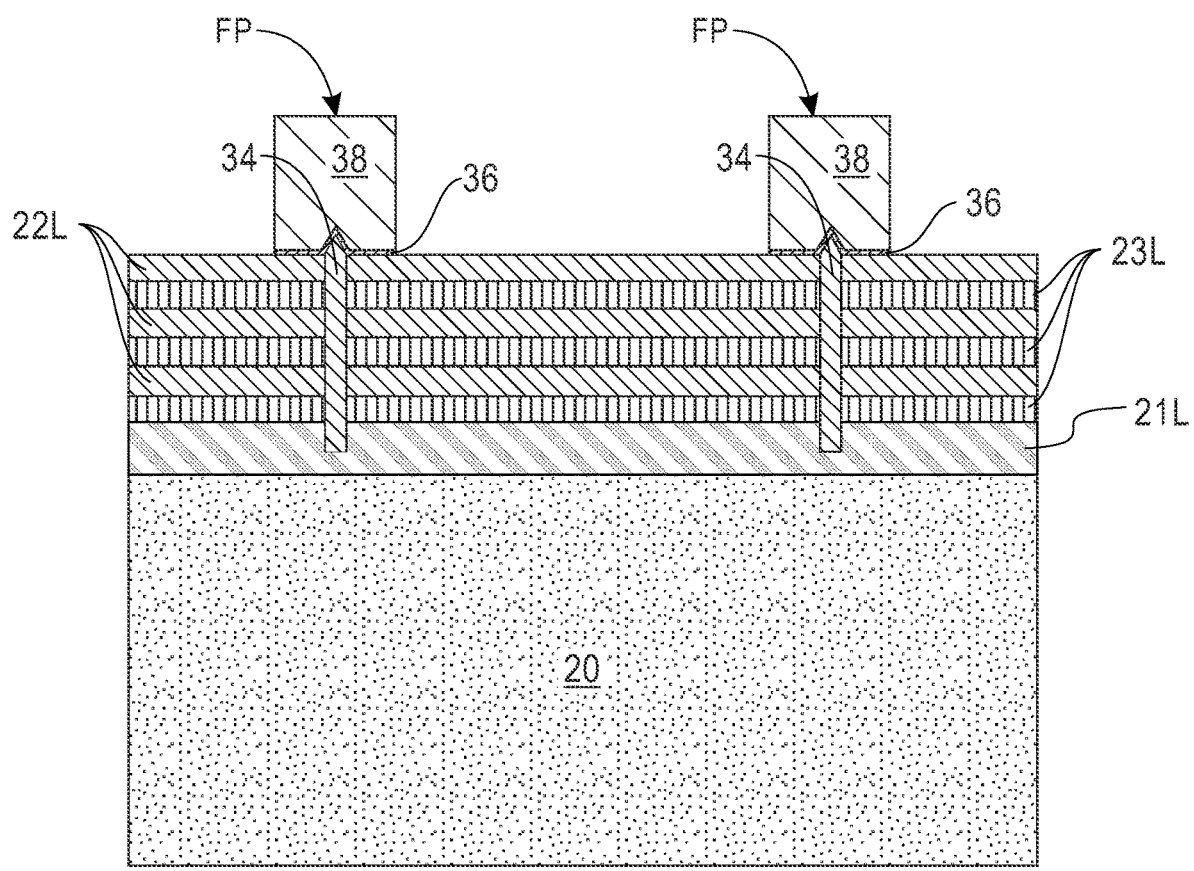
FIG. 9 is a cross sectional view of the exemplary structure shown in FIG. 8 after patterning the second hard mask layer and the second pad oxide layer to provide a fin patterned structure over the through-stack semiconductor channel material.

Referring now to FIG. 9, there is illustrated the exemplary structure shown in FIG. 8 after patterning the second hard mask layer 38L and the second pad oxide layer 36L to provide a fin patterned structure FP over the through-stack semiconductor channel material 34 and on a portion of the material stack MS. The patterning includes lithography and etching. The etch removes portions of the second hard mask layer 38L and the second pad oxide layer 36L that are not protected by the developed photoresist material. The fin patterned structure FP includes a remaining, i.e., non-etched, portion of the second hard mask layer 38L (hereinafter fin patterned second hard mask 38) and a remaining, non-etched, portion of the second pad oxide layer 36L (hereinafter fin patterned second pad oxide 36). In embodiments, the fin patterned second pad oxide can be omitted. The etch used to provide the fin patterned structure FP includes dry etching, chemical etching or any combination thereof. The etch stops on a surface of the uppermost semiconductor channel material layer 22L of the material stack MS.

Figure 10A:
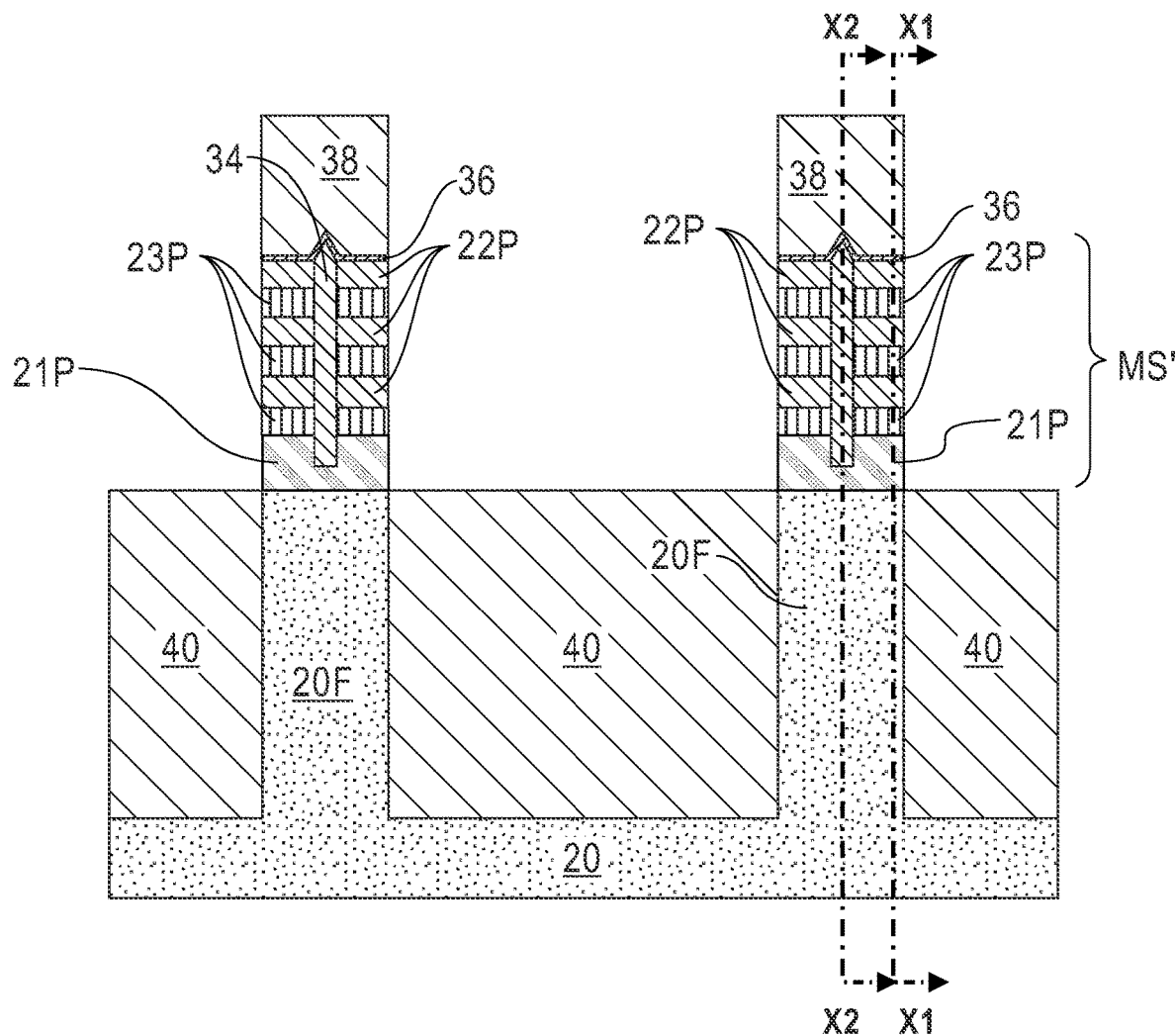
FIG. 10A is a cross sectional view of the exemplary structure shown in FIG. 9 after etching the material stack utilizing the fin patterned structure as an etch mask, wherein the etching stops on a sub-surface of the semiconductor substrate and provides a patterned material stack containing the through-stack semiconductor channel material.
Figure 10B:
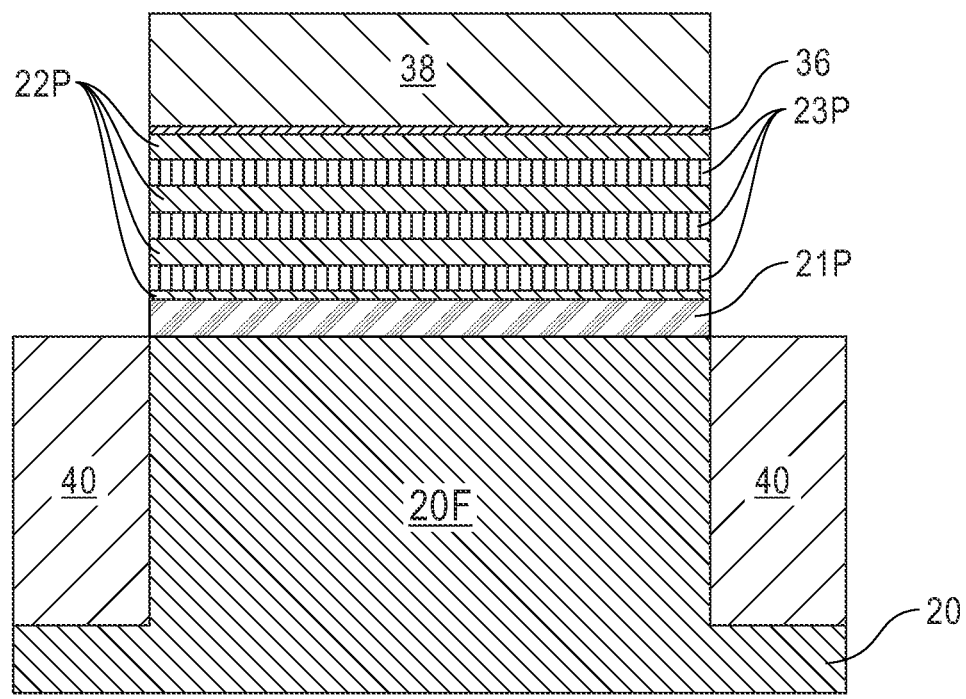
FIG. 10B is a cross sectional view through X1-X1 shown in FIG. 10A; X1-X1 runs into and out of the plane of the drawing and is offset from the center portion of the through-stack semiconductor channel material that is present in the patterned material stack.
Figure 10C:
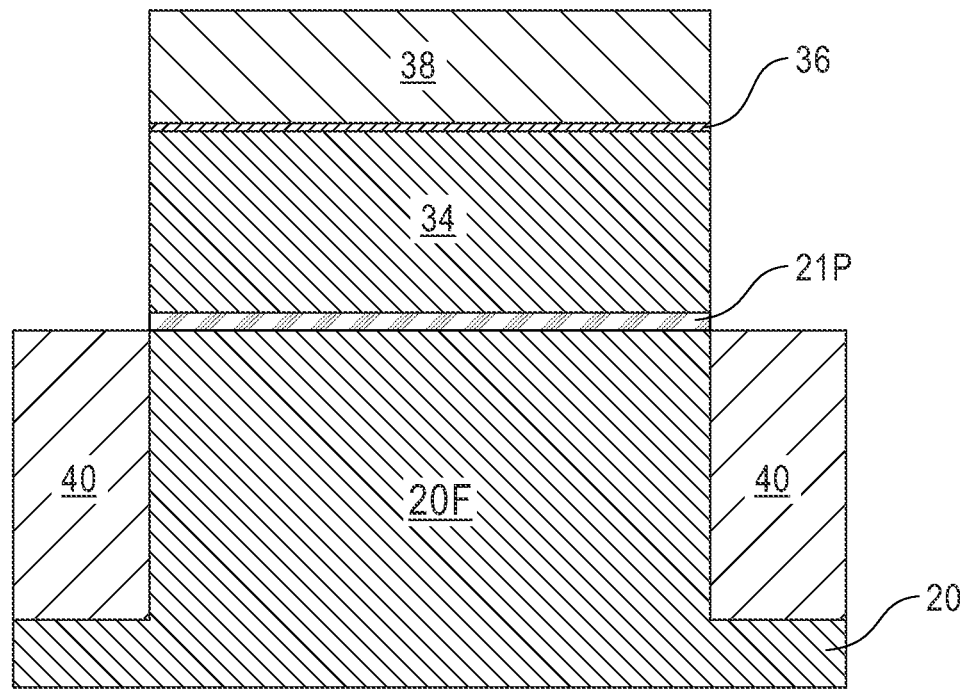
FIG. 10C is a cross sectional view through X2-X2 shown in FIG. 10A; X2-X2 runs into and out of the plane of the drawing and is present in a center portion of the through-stack semiconductor channel material that is present in the patterned material stack.

Referring now to FIG. 10A, there is illustrated the exemplary structure shown in FIG. 9 after etching the material stack MS utilizing the fin patterned structure FP as an etch mask, wherein the etching stops on a sub-surface of the semiconductor substrate 20 and provides a patterned material stack MS' containing the through-stack semiconductor channel material 34. The patterned material stack MS' is located on a semiconductor fin (or mesa) portion 20F of semiconductor substrate 20. Also provided are FIG. 10B and FIG. 10C. FIG. 10B is a cross sectional view through X1-X1 shown in FIG. 10A; X1-X1 runs into and out of the plane of the drawing and is offset from the center portion of the through-stack semiconductor channel material that is present in the patterned material stack. FIG. 10C is a cross sectional view through X2-X2 shown in FIG. 10A; X2-X2 runs into and out of the plane of the drawing and is present in a center portion of the through-stack semiconductor channel material that is present in the patterned material stack.

The etching the material stack MS includes one or more etching processes that stop within a sub-surface (between a topmost surface and a bottommost surface) of the semiconductor substrate 20 such that a trench region is formed laterally adjacent to the semiconductor fin portion 20F. In addition to including the through-stack semiconductor channel material 34, the patterned material stack MS' includes a remaining (i.e., non-etched) portion of each semiconductor channel material layer 22L (hereinafter referred to as a semiconductor channel material layer portion 22P), a remaining portion of each sacrificial semiconductor material layer 23L (hereinafter referred to as a sacrificial semiconductor material portion 23P), and a remaining portion of the bottommost sacrificial semiconductor material layer 21L (hereinafter referred to as a bottommost sacrificial semiconductor material layer portion 21P).

Figure 11A:
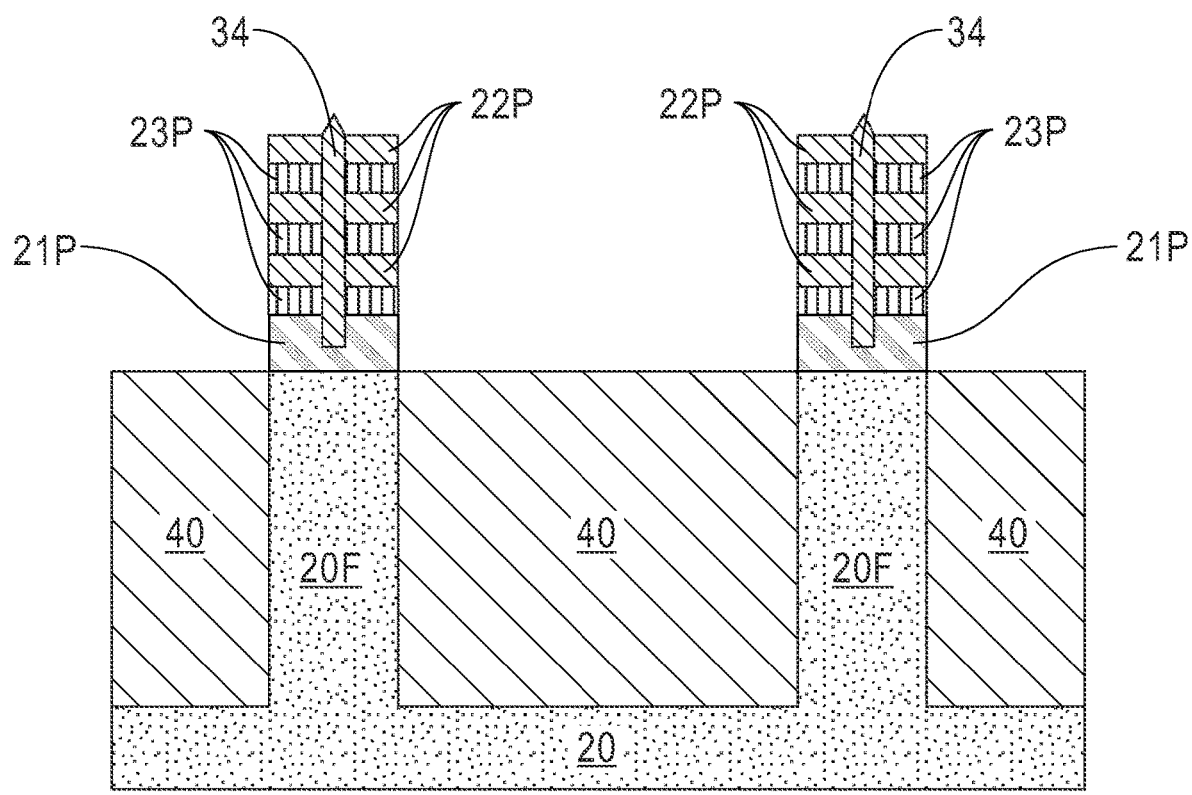
FIGS. 11A, 11B and 11C are cross sectional views of the exemplary structure shown in FIGS. 10A, 10B and 10C, respectively, after forming a shallow trench isolation structure on a recessed surface of the semiconductor substrate, and removing the fin patterned structure to reveal the patterned material stack.
Figure 11B:
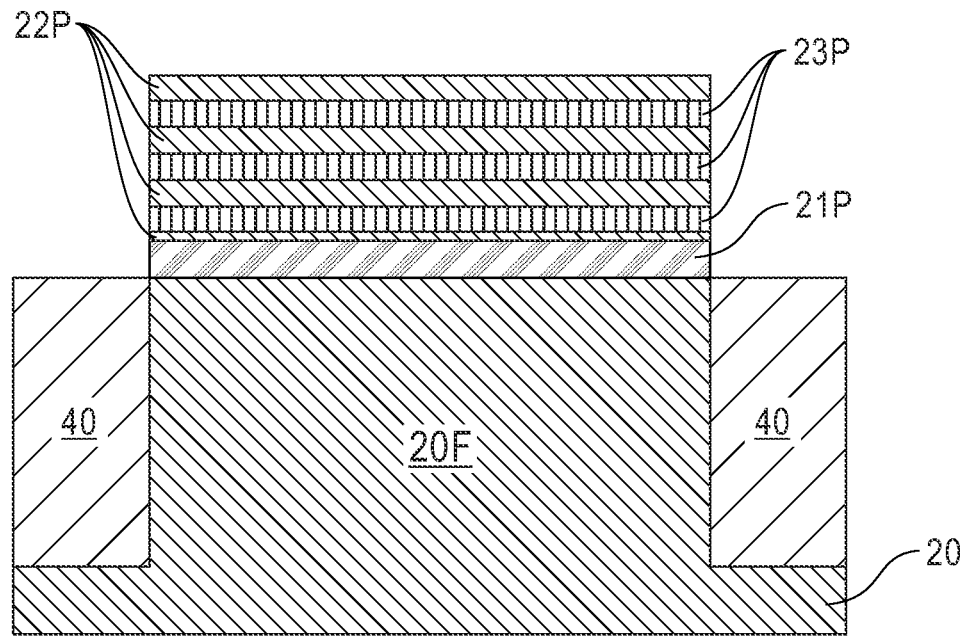
Figure 11C:
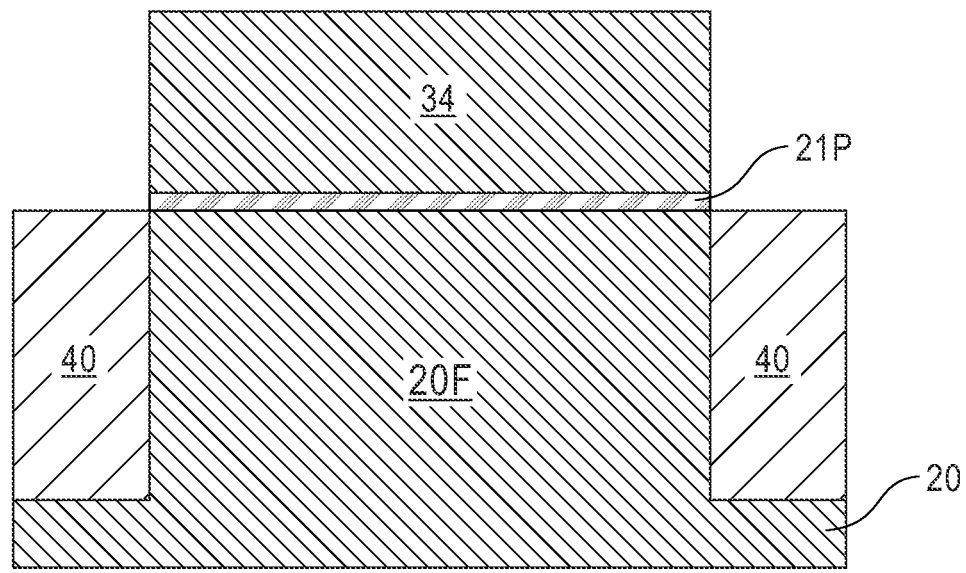

Referring now to FIGS. 11A, 11B and 11C, there are illustrated the exemplary structure shown in FIGS. 10A, 10B and 10C, respectively, after forming a shallow trench isolation structure 40 on a recessed surface of the semiconductor substrate 20 (and in the trench that is located laterally adjacent in semiconductor fin portion 20F), and removing the fin patterned structure FP to reveal the patterned material stack MS'. The shallow trench isolation structure 40 can be formed by first depositing a trench dielectric material such as, for example, a silicon dioxide, on the recessed surface of the semiconductor substrate 20 and thereafter performing a recess etch to reduce the height of the as deposited trench dielectric material. The shallow trench isolation structure 40 typically has topmost surface that is substantially coplanar (i.e., within ±10%) with a topmost surface of the semiconductor fin portion 20F. In embodiments (not shown), a trench liner can be formed prior to deposited the trench dielectric material. In embodiments, a densification process can follow the deposition of the trench dielectric material. The fin patterned structure FP can be removed utilizing one or more one or more material removal processes that is(are) selective in removing the fin patterned second hard mask 38 and the fin patterned second pad oxide 36. Typically, a first material removal process is used to remove the fin patterned second hard mask 38, and a second material removal process is used to remove the fin patterned second pad oxide 36.

Figure 12A:
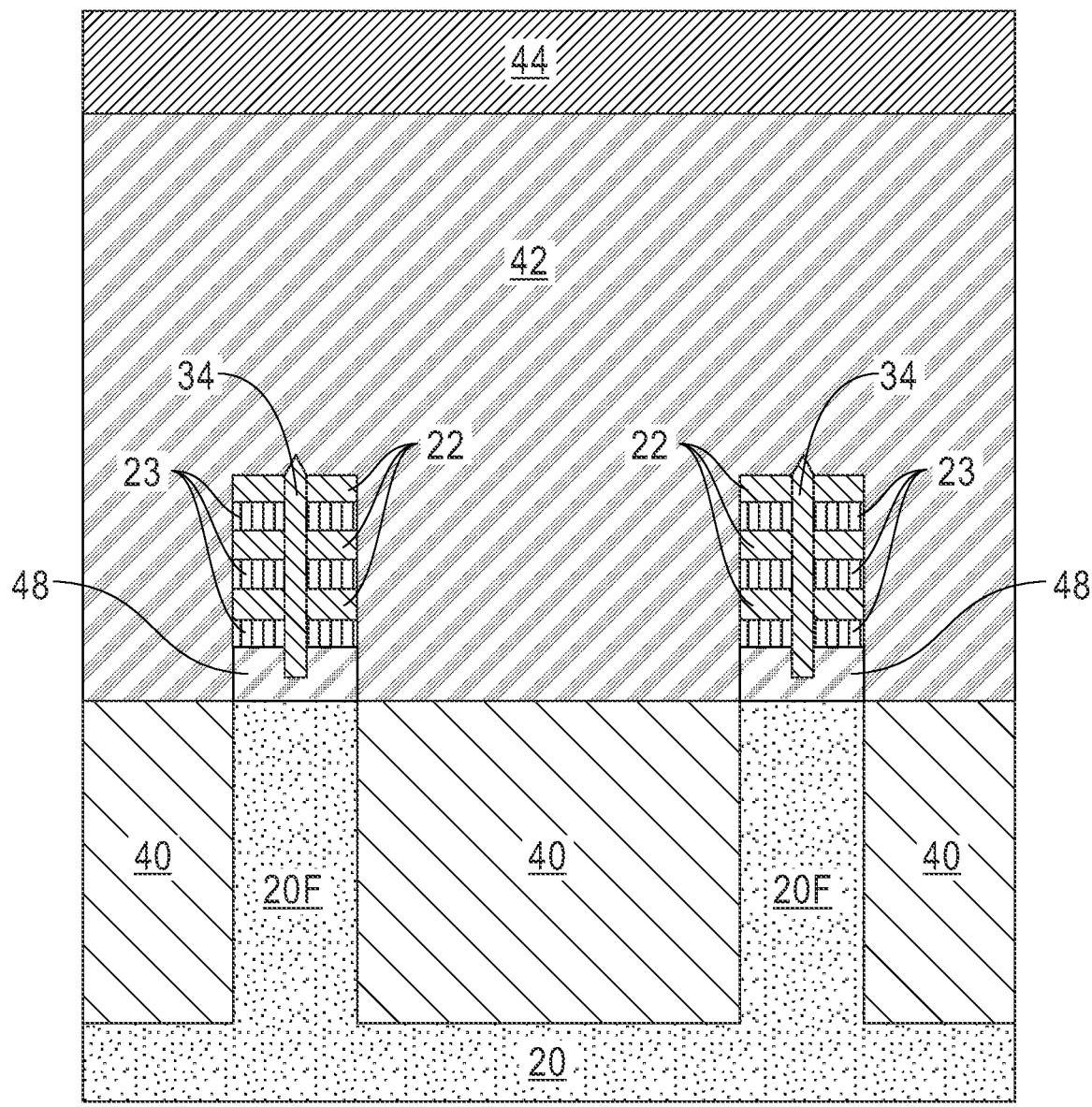
FIGS. 12A, 12B and 12C are cross sectional views of the exemplary structure shown in FIGS. 11A, 11B and 11C, respectively, after forming a hard masked capped sacrificial gate structure and a dielectric spacer on a surface of the patterned material stack, replacing the bottommost sacrificial semiconductor material nanosheet with a bottom dielectric isolation layer, etching the patterned material stack utilizing the hard masked capped sacrificial gate structure and the dielectric spacer as a combined etch mask to provide a nanosheet stack of alternating sacrificial semiconductor material nanosheets and semiconductor channel material nanosheets, recessing the sacrificial semiconductor material nanosheets, forming an inner spacer in gaps created by the recessing, and forming a source/drain region extending outward from each semiconductor channel material nanosheet.
Figure 12C:
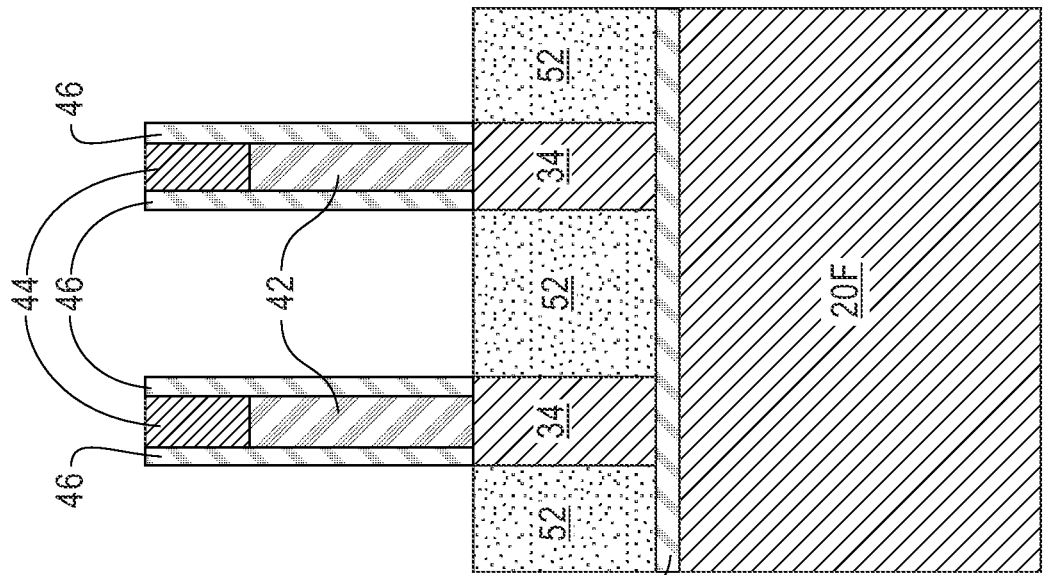
Figure 12B:
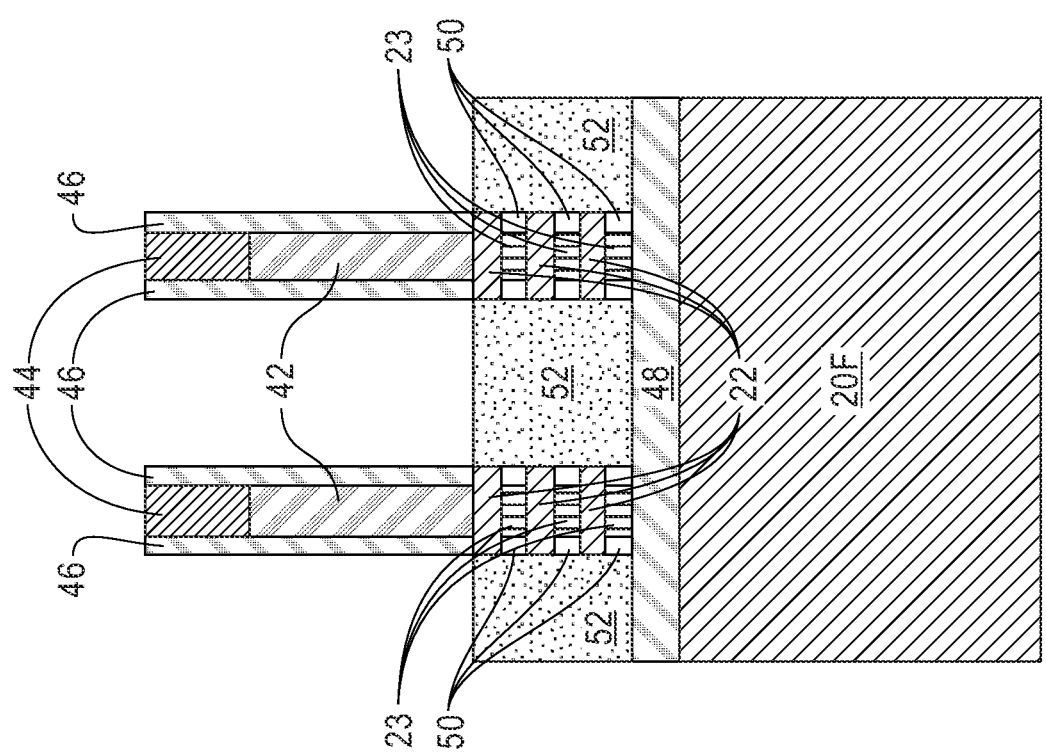

Referring now to FIGS. 12A, 12B and 12C, there are illustrated the exemplary structure shown in FIGS. 11A, 11B and 11C, respectively, after forming a hard masked capped sacrificial gate structure (42/44) and a dielectric spacer 46 on a surface of the patterned material stack MS', replacing the bottommost sacrificial semiconductor material nanosheet (not shown) with a bottom dielectric isolation layer 48, etching the patterned material stack MS' utilizing the hard masked capped sacrificial gate structure (42/44) and the dielectric spacer 46 as a combined etch mask to provide a nanosheet stack of alternating sacrificial semiconductor material nanosheets 23 and semiconductor channel material nanosheets 22, recessing the remaining sacrificial semiconductor material nanosheets 23, forming an inner spacer 50 in gaps created by the recessing, and forming a source/drain region 52 from each semiconductor channel material nanosheet 22. Note that in some embodiments, the remining portion of the bottommost semiconductor channel material layer can be removed during the forming of the dielectric isolation layer 48.

The hard masked capped sacrificial gate structure (42/44) includes a sacrificial gate material 42 and a sacrificial gate cap 44. In some embodiments, a sacrificial gate dielectric material can be located beneath the sacrificial gate material 42. The hard masked capped sacrificial gate structure (42/44) can be formed by depositing blanket layers of a sacrificial gate dielectric material (such as, for example, silicon dioxide), a sacrificial gate material (such as, for example, polysilicon or a metal), and a dielectric hard mask material (such as, for example, silicon nitride); note that the dielectric hard mask material provides the sacrificial gate cap 44. In some embodiments, the depositing of a blanket layer of the sacrificial gate dielectric material can be omitted. The depositing of the blanket layers of the dielectric hard mask material, sacrificial gate material, and sacrificial gate dielectric material includes, but is not limited to, CVD, PECVD, PVD, ALD or any combination of such deposition processes. After forming the blanket layers of sacrificial gate dielectric material, sacrificial gate material, and hard mask material, a patterning process (including lithography and etching) is used to convert the blanket layer of hard mask material into sacrificial gate cap 44 and the blanket layers of sacrificial gate material and the sacrificial gate dielectric material into a sacrificial gate structure that includes at least sacrificial gate material 42 and optionally the sacrificial gate dielectric material.

After forming hard masked capped sacrificial gate structure (42/44), dielectric spacer 46 is then formed by deposition of a dielectric spacer material, followed by a spacer etch. The dielectric spacer material that provides dielectric spacer 46 can include silicon dioxide or silicon nitride. At this point of the present application, the remaining bottommost sacrificial material layer portion 21P is replaced with a dielectric material to provide the bottom dielectric isolation layer 48. This replacing includes etching, deposition of a dielectric material, and thereafter performing an etch back process. Note that in some embodiments, the remining portion of the bottommost semiconductor channel material layer can be removed during the etch used during the replacement of the remaining bottommost sacrificial material layer portion 21P with dielectric isolation layer 48.

The etching of the patterned material stack MS' utilizing the hard masked capped sacrificial gate structure (42/44) and the dielectric spacer 46 as a combined etch mask includes one or more etching (dry and/or wet) processes. The nanosheet stack includes a remaining (i.e., un-etched) portion of the patterned material stack including remaining portions of each sacrificial semiconductor material layer portion 23P (hereinafter referred to as sacrificial semiconductor material nanosheets 23) and remaining portions of each semiconductor channel material layer portion 22P (hereinafter semiconductor channel material nanosheets 22). The semiconductor channel material nanosheets include the through-stack semiconductor channel material 34.

After forming the nanosheet stack, each sacrificial semiconductor material nanosheet 23 is recessed as shown in FIG. 12B. The recessing forms a gap laterally adjacent to each recessed sacrificial semiconductor material nanosheet 23. After this recessing step, the remaining (i.e., recessed) sacrificial semiconductor material nanosheets 23 have a reduced width as compared to the width of the original sacrificial semiconductor material nanosheets. The recessing includes a lateral etching process that is selective in removing the sacrificial semiconductor material nanosheets 23 relative to the semiconductor channel material nanosheets 22. Inner spacer 50 is then formed in each gap that is created during the recessing of each sacrificial semiconductor material nanosheet 23. The forming of the inner spacer 50 includes conformal deposition of another dielectric spacer material, followed by an isotropic etching. The another dielectric spacer material can be compositionally the same as, or compositionally, different from the dielectric spacer material that provides dielectric spacer 46.

Source/drain region 52 is then formed from exposed sidewalls of each semiconductor channel material nanosheet as is shown in FIG. 12B and on physically exposed portions of the through-stack semiconductor channel material 34 as is shown in FIG. 12C. The source/drain region 52 is formed by an epitaxial growth process as defined above. A recess etch can be optionally employed so as to reduce the height of each of the source/drain region 52. As used herein, a "source/drain" region can be a source region or a drain region depending on subsequent wiring and application of voltages during operation of the nanosheet device. The source/drain region 52, which is formed on each side of hard masked capped sacrificial gate structure (42/44), has a sidewall that is in direct physical contact with the outermost sidewalls of each semiconductor channel material nanosheet 22 and another sidewall in direct physical contact with a sidewall of the through-stack semiconductor channel material 34. The source/drain region 52 is composed of a semiconductor material and a dopant. The semiconductor material that provides the source/drain region 52 can include one of the semiconductor materials mentioned above. The semiconductor material that provides the source/drain region 52 can be compositionally the same, or compositionally different from each semiconductor channel material nanosheet 22. The dopant that is present in the source/drain region 52 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain region 52 can have a dopant concentration of from $4\times10^{20}$ atoms/cm$^3$ to $3\times10^{21}$ atoms/cm$^3$. In one example, the source/drain region 52 is composed of phosphorus doped silicon.

Figure 13A:
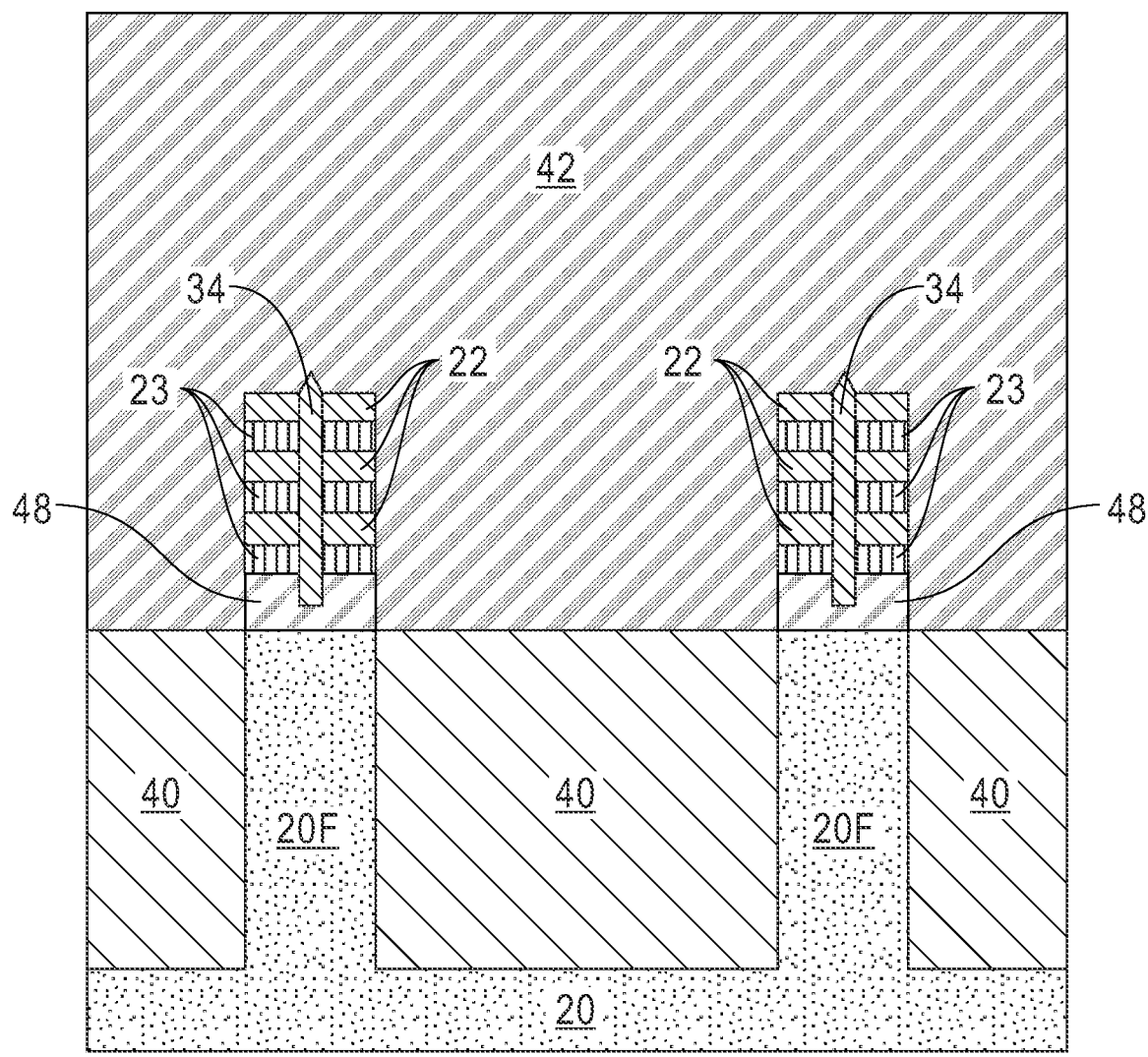
FIGS. 13A, 13B and 13C are cross sectional views of the exemplary structure shown in FIGS. 12A, 12B and 12C, respectively, after forming a first interlayer dielectric (ILD) material layer on the source/drain region.
Figure 13C:
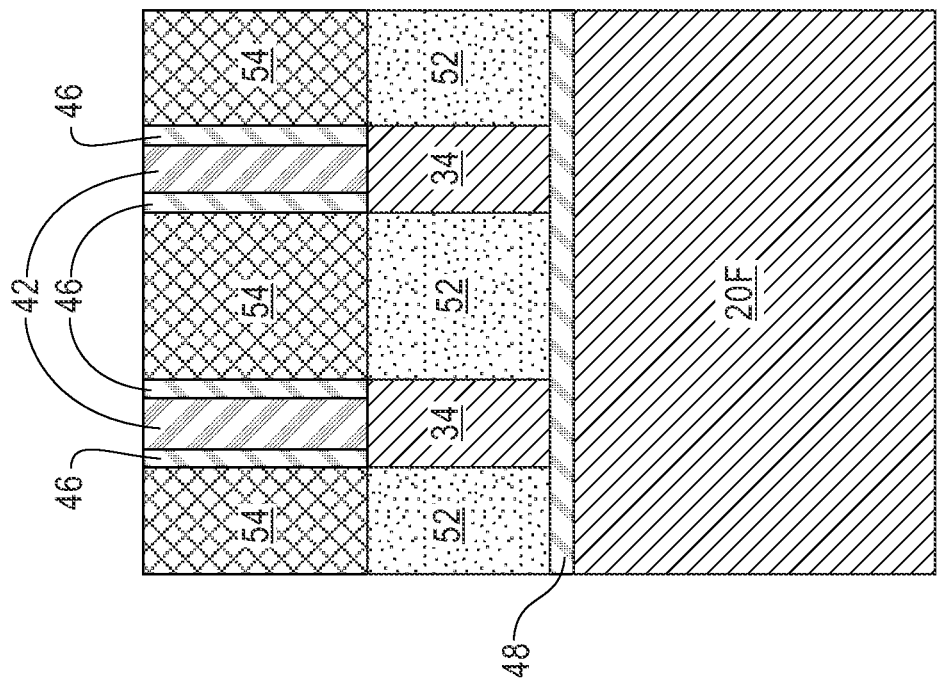
Figure 13B:
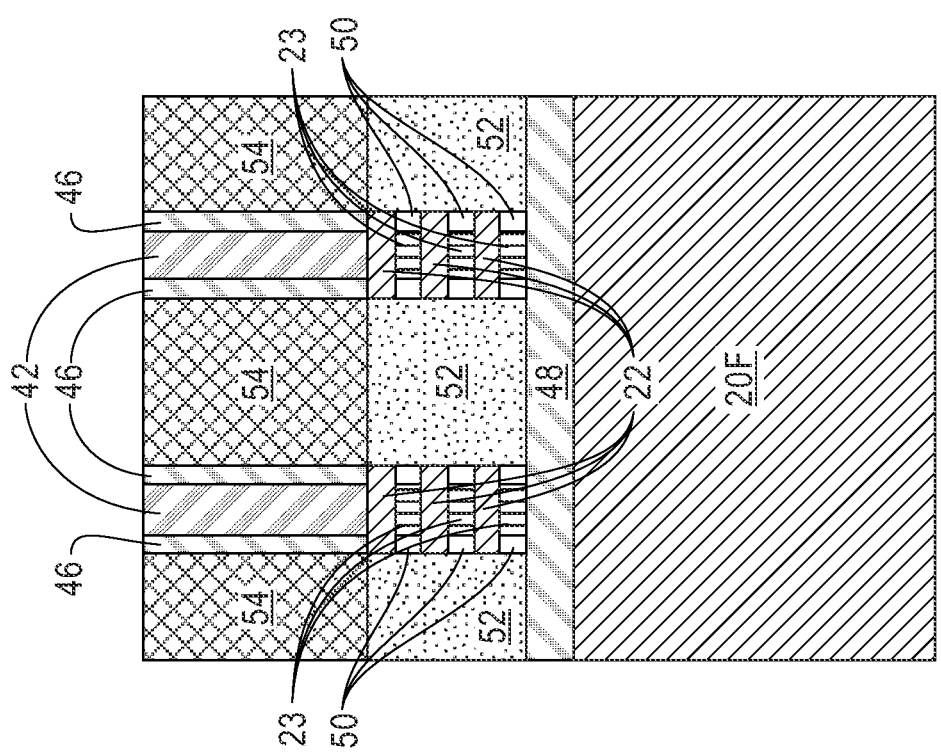

Referring now to FIGS. 13A, 13B and 13C, there are illustrated the exemplary structure shown in FIGS. 12A, 12B and 12C, respectively, after forming a first interlayer dielectric (ILD) material layer 54 on the source/drain region 52. The first ILD material layer 54 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the first ILD material layer 54 can include a multilayered structure that includes at least two different dielectric materials stacked one atop the other such as, for example, silicon nitride and silicon dioxide. The first ILD material layer 54 can be formed by a deposition process such as, for example, CVD, PECVD, or spin-on coating. A planarization process can be performed after the deposition of the dielectric material that provides the first ILD material layer 54. During the planarization process, the sacrificial gate cap 44 and an upper portion of dielectric spacer 46 are removed. The first ILD material layer 54 typically has a topmost surface that is coplanar with a topmost surface of the sacrificial gate material 42 and a topmost surface of the remaining portion of dielectric spacer 46, see, for example, FIGS. 13B and 13C.

Figure 14A:
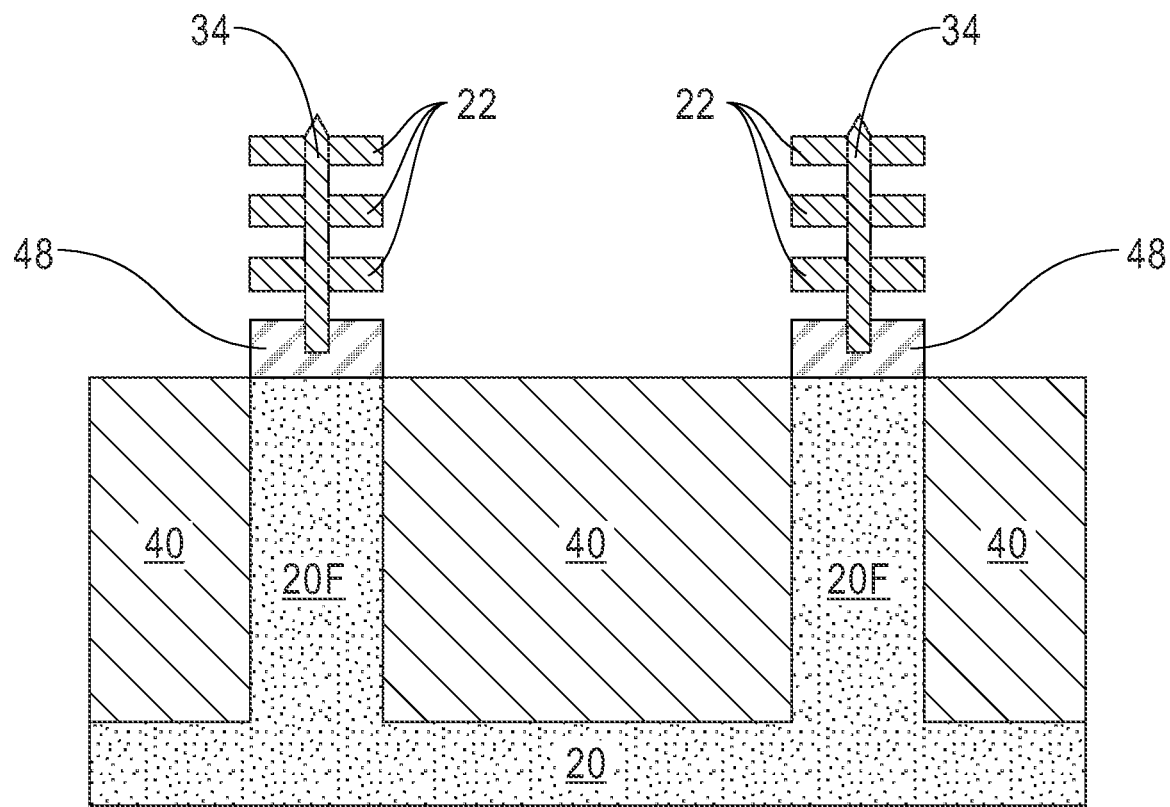
FIGS. 14A, 14B and 14C are cross sectional views of the exemplary structure shown in FIGS. 13A, 13B and 13C, respectively, after removing the sacrificial gate structure and removing the recessed sacrificial semiconductor material nanosheets to reveal a semiconductor channel material structure in accordance with the present application.
Figure 14C:
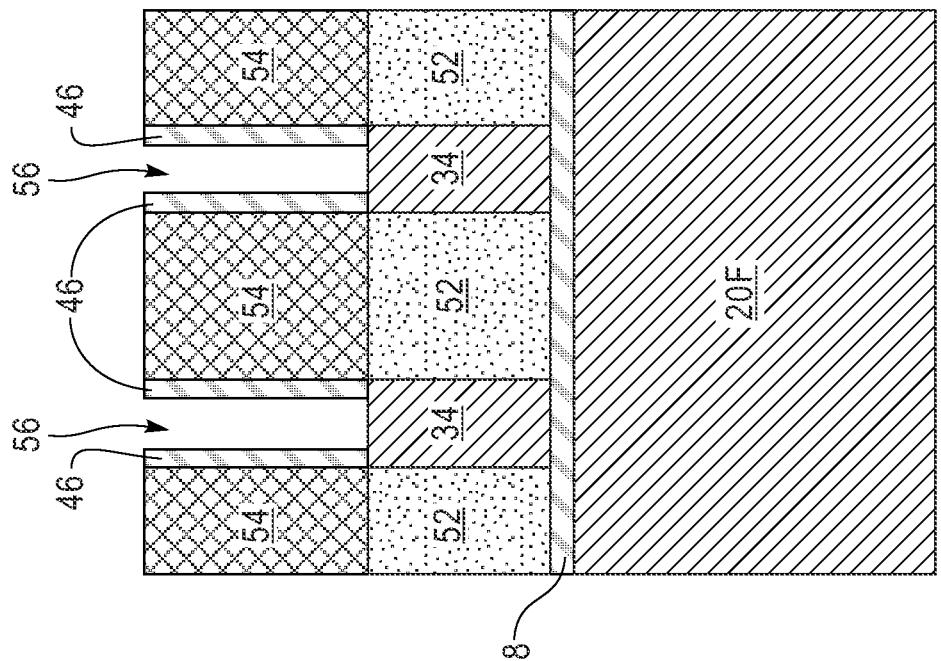
Figure 14B:
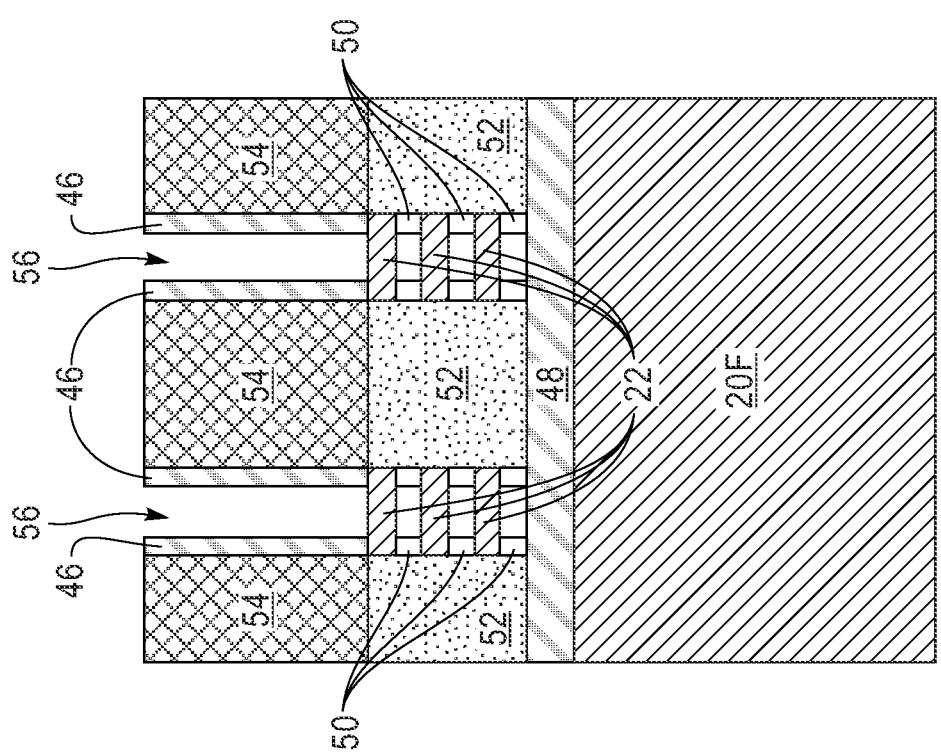

Referring now to FIGS. 14A, 14B and 14C, there are illustrated the exemplary structure shown in FIGS. 13A, 13B and 13C, respectively, after removing the sacrificial gate material 42 and removing the recessed sacrificial semiconductor material nanosheets 23 to reveal a semiconductor channel material structure in accordance with the present application, i.e., a semiconductor channel material structure containing a plurality of semiconductor channel material nanosheets 22 stacked one atop the other and at least one through-stack semiconductor channel material 34 extending through at least one of the semiconductor channel material nanosheets 22 of the plurality of semiconductor channel material nanosheets. The removal of the sacrificial gate material 42 can include an etching process that is selective in removing the sacrificial gate material 42. When present, the sacrificial gate dielectric material is also removed at this time of the present application. The recessed sacrificial semiconductor material nanosheet 23 are removed utilizing an etch that is selective in removing the sacrificial semiconductor material nanosheets 23 relative to the semiconductor channel material nanosheets 22 and the through-stack semiconductor channel material 34. For example, an etch can be used to selectively remove SiGe sacrificial semiconductor material nanosheets relative to Si semiconductor channel material nanosheets and a Si through-stack semiconductor channel material. Each semiconductor channel material nanosheet 22 is now suspended as is shown in FIGS. 14A and 14B.

Figure 15A:
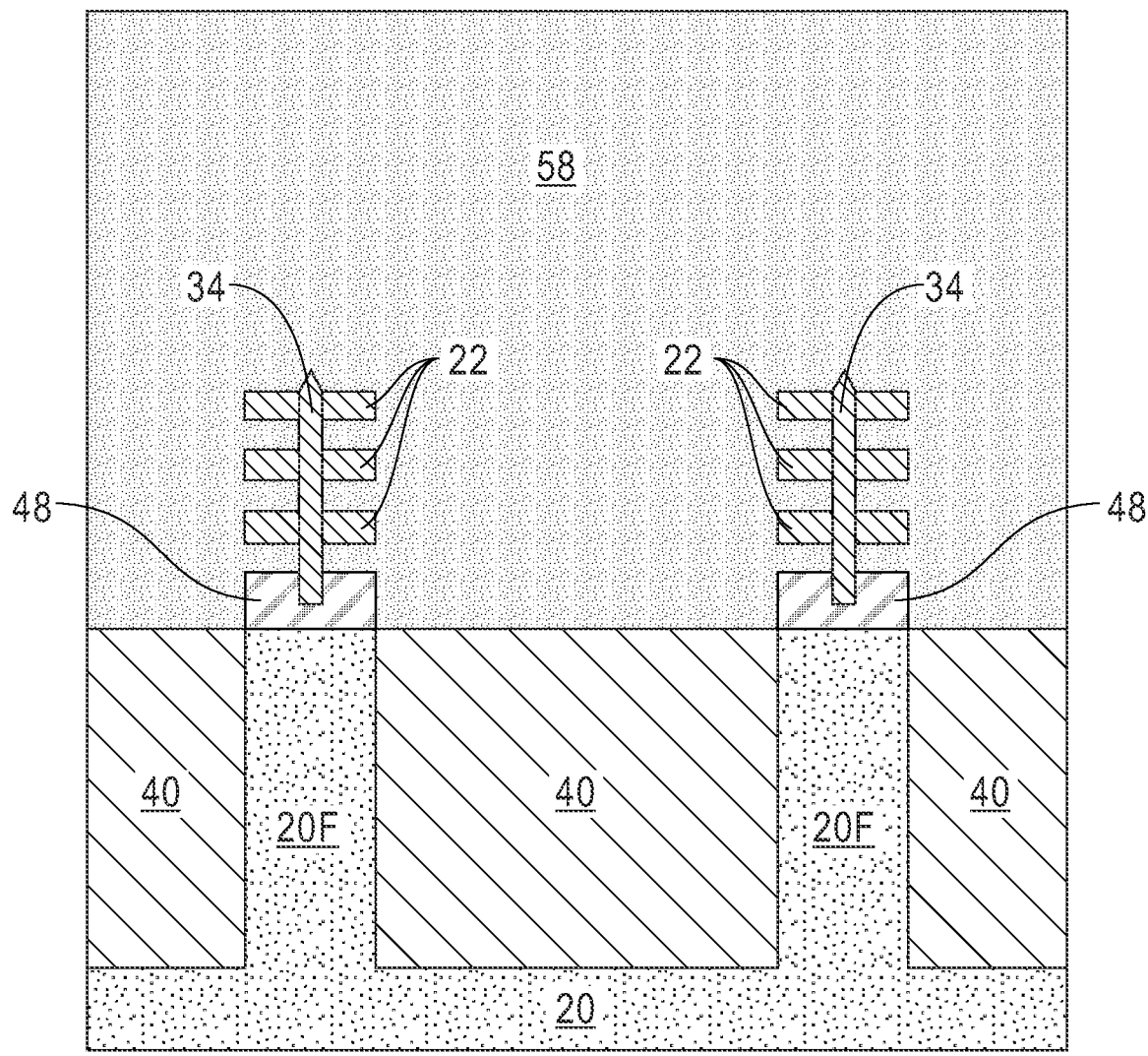
FIGS. 15A, 15B and 15C are cross sectional views of the exemplary structure shown in FIGS. 14A, 14B and 14C, respectively, after forming a functional gate structure on physically exposed surfaces of the semiconductor channel material structure.
Figure 15C:
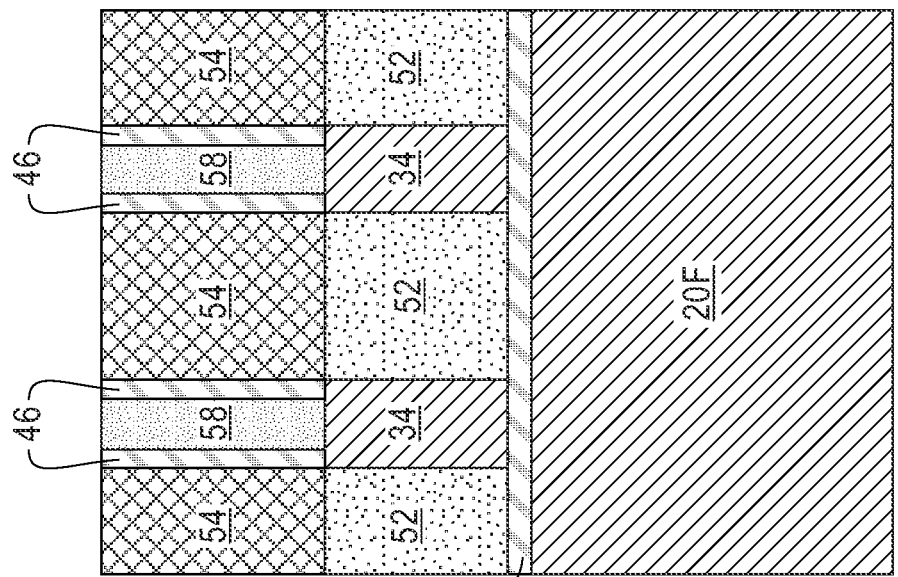
Figure 15B:
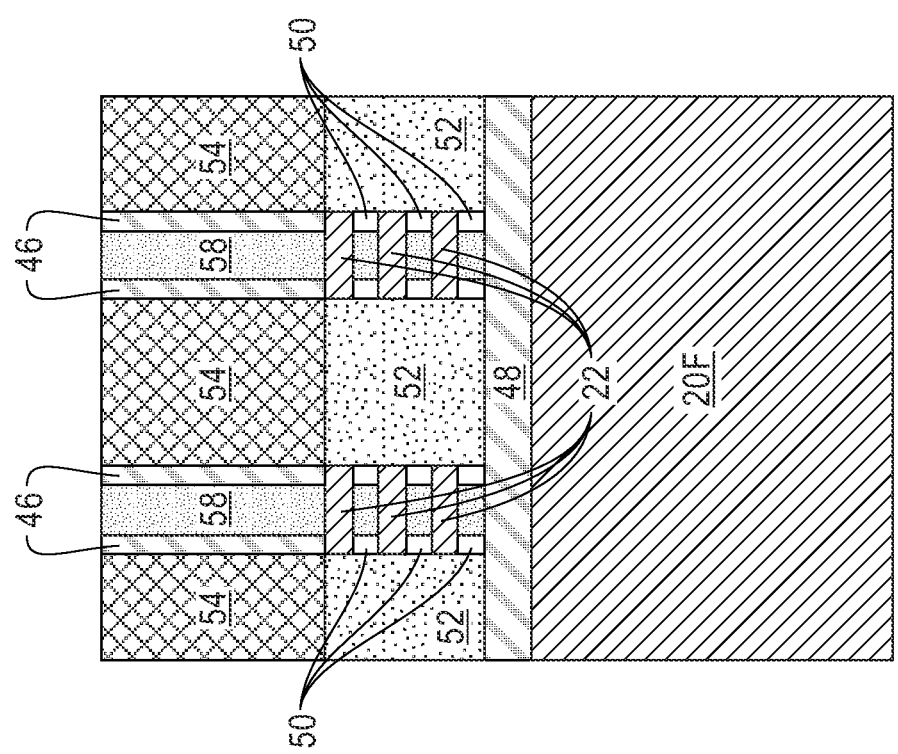

Referring now to FIGS. 15A, 15B and 15C, there are illustrated the exemplary structure shown in FIGS. 14A, 14B and 14C, respectively, after forming a functional gate structure 58 on physically exposed surfaces of the surfaces of the semiconductor channel material structure including each semiconductor channel material nanosheet 22 and the through-stack semiconductor channel material 34. The functional gate structure 58 includes forming a gate dielectric material and a gate electrode material. The gate dielectric material can include silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiON), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb(Sc,Ta)$O_3$), and/or lead zinc niobite (Pb(Zn,Nb)O). The high-k gate dielectric material can further include dopants such as lanthanum (La), aluminum (Al) and/or magnesium (Mg). The gate dielectric material can be formed utilizing a deposition process such as, for example, ALD, CVD, PECVD, or PVD. The gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a work function metal can be present between the gate dielectric material and the gate electrode. In other embodiments, the gate electrode is composed of only a WFM. The WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The WFM is a conformal layer which can be formed by a conformal deposition process such as, for example, ALD, CVD or PECVD. The WFM layer can have a thickness in the range of 1 nm to 20 nm, although other thickness above or below this range may be used as desired for a particular application.

The functional gate structure 58 can be formed utilizing conventional means including deposition of the various gate material layers described above, followed by a planarization process such as, for example, chemical mechanical polishing (CMP). In some embodiments (not shown) a gate cap can be present on a recessed surface of the functional gate structure 58.

Figure 16A:
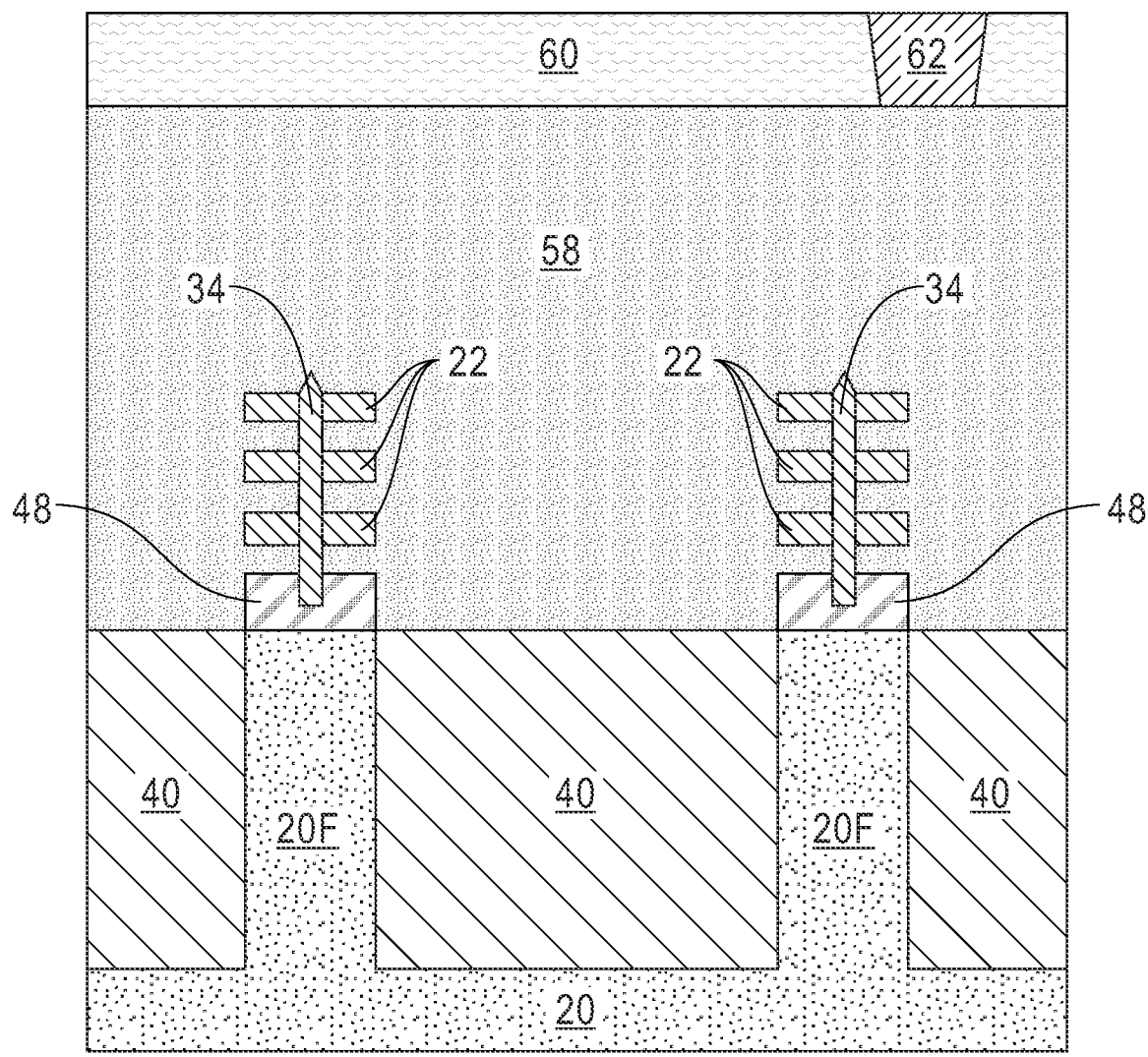
FIGS. 16A, 16B and 16C are cross sectional views of the exemplary structure shown in FIGS. 15A, 15B and 15C, respectively, after forming a second ILD material layer, wherein the second ILD material layer includes a gate contact structure and a source/drain contact structure embedded therein.
Figure 16C:
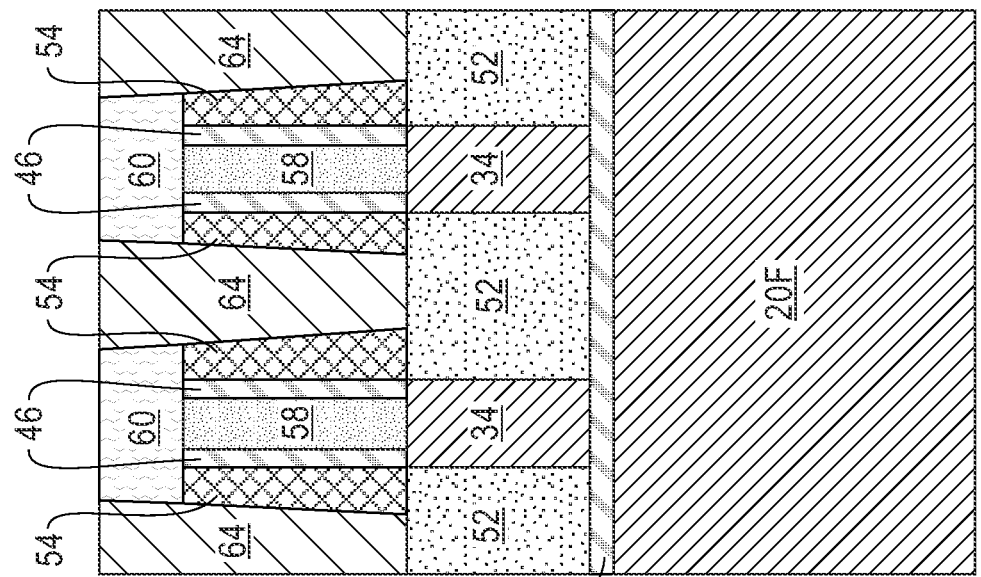
Figure 16B:
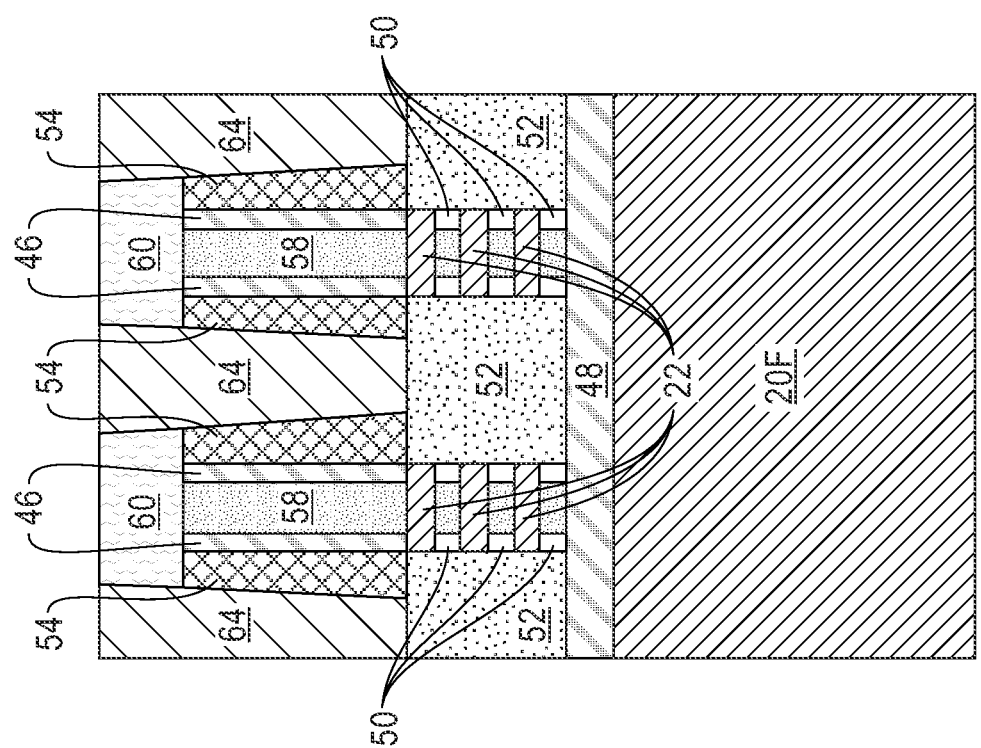

Referring now to FIGS. 16A, 16B and 16C, there are illustrated the exemplary structure shown in FIGS. 15A, 15B and 15C, respectively, after forming a second ILD material layer 60, wherein the second ILD material layer 60 includes a gate contact structure 62 (which contacts a portions of the gate electrode of the functional gate structure 58) and a source/drain contact structure 64 (which contacts the source/drain region 52) embedded therein. In FIGS. 16B and 16C. The second ILD material layer 60 includes one of the dielectric materials mentioned above for the first ILD material layer 54. The dielectric material that provides the second ILD material layer 60 can be compositionally the same as, or compositionally different from, the dielectric material that provides the first ILD material layer 54. The second ILD material layer 60 can be formed utilizing one of the deposition processes mentioned above in forming the first ILD material layer 54.

Each contact structure, i.e., the gate contact structure 62 and the source/drain contact structure 64 includes at least a contact conductor material. In some embodiments (not shown), a contact liner can be present along the sidewalls and bottom wall of the each contact structure. In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed. The contact conductor material that provides each contact structure includes, but is not limited to, W, Cu, Al, Co, Ru, Mo, Os, Ir, Rh or an alloy thereof. The contact conductor material can be formed by any suitable deposition method such as, for example, ALD, CVD, PVD or plating. A planarization process can be used to remove the contact conductor material and the contact liner (when provided) that are located above the second ILD material layer 60. The remaining contact conductor material and if present, the contact liner provide the contact structures (i.e., gate contact structure 62 and source/drain contact structure 64) shown in FIGS. 16A, 16B and 16C.

Reference will now be made to FIGS. 17-21C, which illustrate processing steps that can be used in providing a semiconductor structure in accordance with the present application including a functional gate structure formed on physically exposed surfaces of a semiconductor channel material structure in accordance with another embodiment of the present application. In this embodiment, both the semiconductor channel material structures shown in FIGS. 2A and 2B will be formed into a single structure so as to provide an embodiment in which a short channel nanosheet device and a long channel nanosheet device can be formed. In FIGS. 17-21C, like elements and components from the previous embodiment depicted in FIGS. 4-16C have the same reference numerals.

Figure 17:
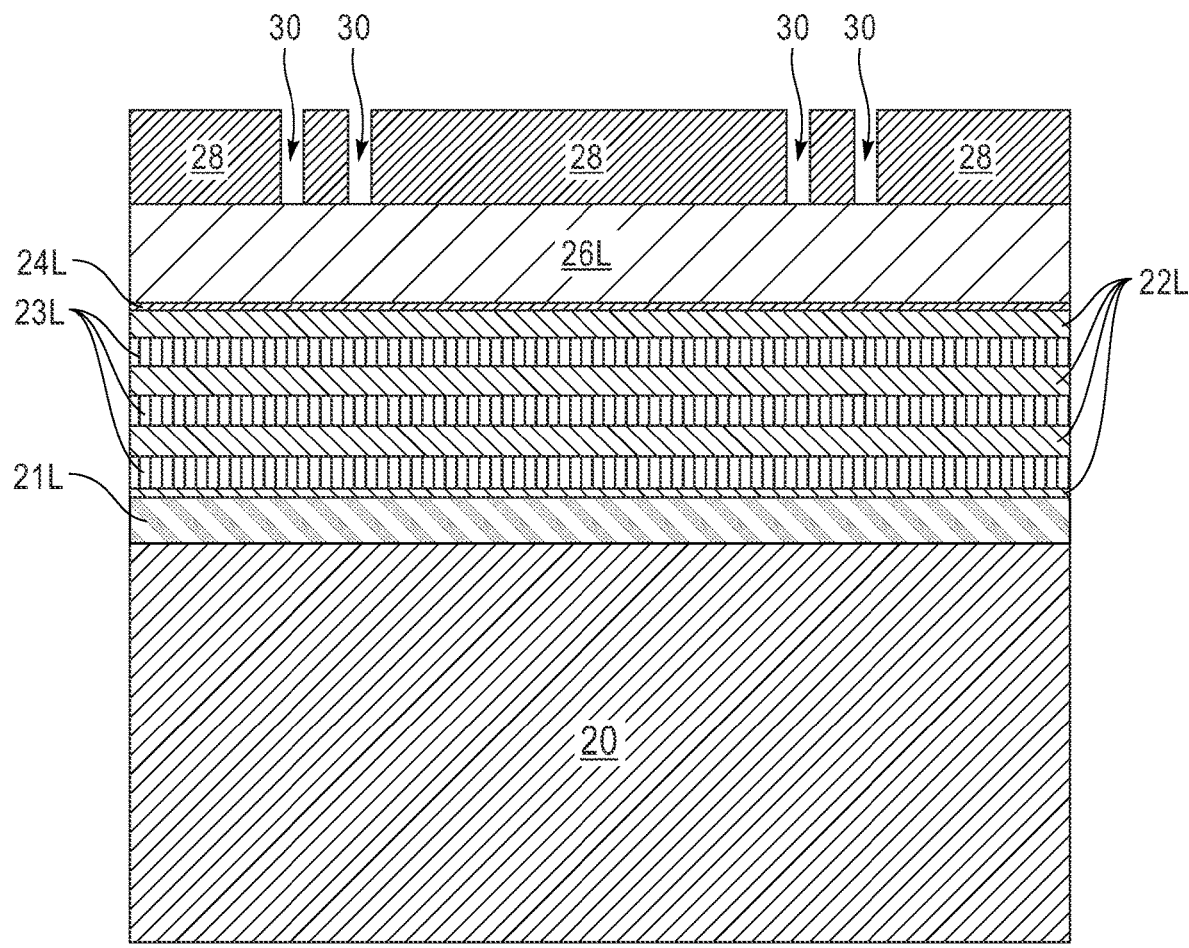
FIG. 17 is a cross sectional view of the exemplary structure shown in FIG. 4 after forming a patterned lithographic stack having a plurality of trench openings on the first hard mask layer.

Referring first to FIGS. 17, there is illustrated the exemplary structure shown in FIG. 4 after forming a patterned lithographic stack 28 having a plurality of trench openings 30 on the first hard mask layer 26L. In this embodiment, at least a pair of the trench openings 30 are spaced apart from each other by a distance from 2 nm to 65 nm. Other distances between the pair of the trench openings 30 can be used in the present application as well. The patterned lithographic stack 28 that is used in this embodiment of the present application is the same as used in the previous embodiment except that this embodiment of the present application requires a plurality of openings 30 to be formed into the lithographic stack 28. As such the materials and technique mentioned above for forming the patterned lithographic stack 28 can be used here in this embodiment of the present application. Instead of using a patterned lithographic stack 28 this embodiment also contemplates the alternative patterning embodiments of SIT and DSA mentioned above.

Figure 18:
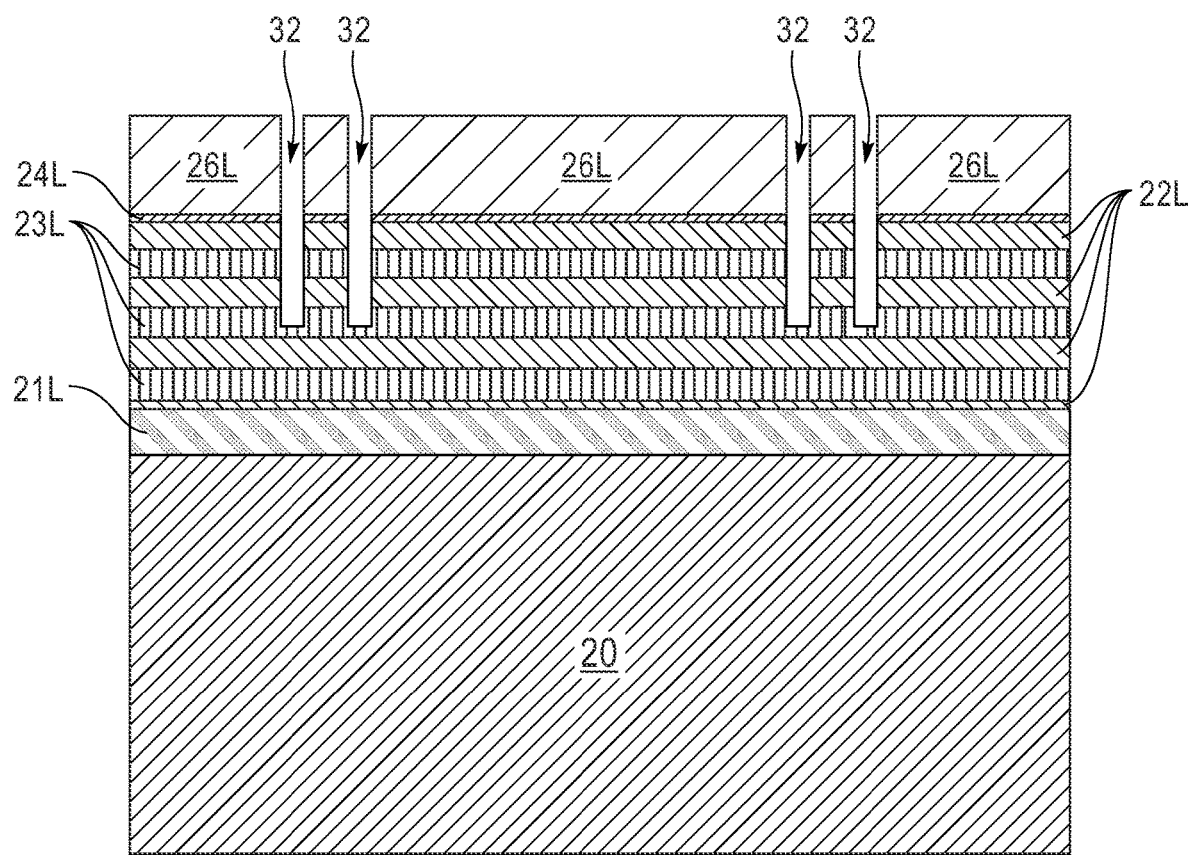
FIG. 18 is a cross sectional view of the exemplary structure shown in FIG. 17 after transferring the plurality of trench openings into the first hard mask layer, the first pad oxide layer, and partially into the material stack to provide a plurality of through-stack trench openings in the exemplary structure, and removing the patterned lithographic stack, the transferring stops on a surface of one of the sacrificial semiconductor material layers other that the topmost sacrificial semiconductor material layer and the sacrificial semiconductor material layer that is located immediately above the bottommost semiconductor channel material layer.

Referring now to FIG. 18, there is illustrated the exemplary structure shown in FIG. 17 after transferring the plurality of trench openings 30 into the first hard mask layer 26L, the first pad oxide layer 24L, and partially into the material stack to provide a plurality of through-stack trench openings 32 in the exemplary structure, and removing the patterned lithographic stack 28. In this embodiment, the transferring stops on a surface of one of the sacrificial semiconductor material layers 23L (in the illustrated embodiment the transferring stops on a surface of the middle sacrificial semiconductor material layer 23L) other that the topmost sacrificial semiconductor material layer 23L and the sacrificial semiconductor material layer 23L that is located immediately above the bottommost semiconductor channel material layer 22L (which as before will be removed from the structure during formation of the bottom dielectric isolation layer 48). The transferring includes one or more etching processes as described above for forming the at least one through-stack trench opening 32 shown in FIG. 6. The patterned lithographic stack 28 is removed as described above.

Figure 19:
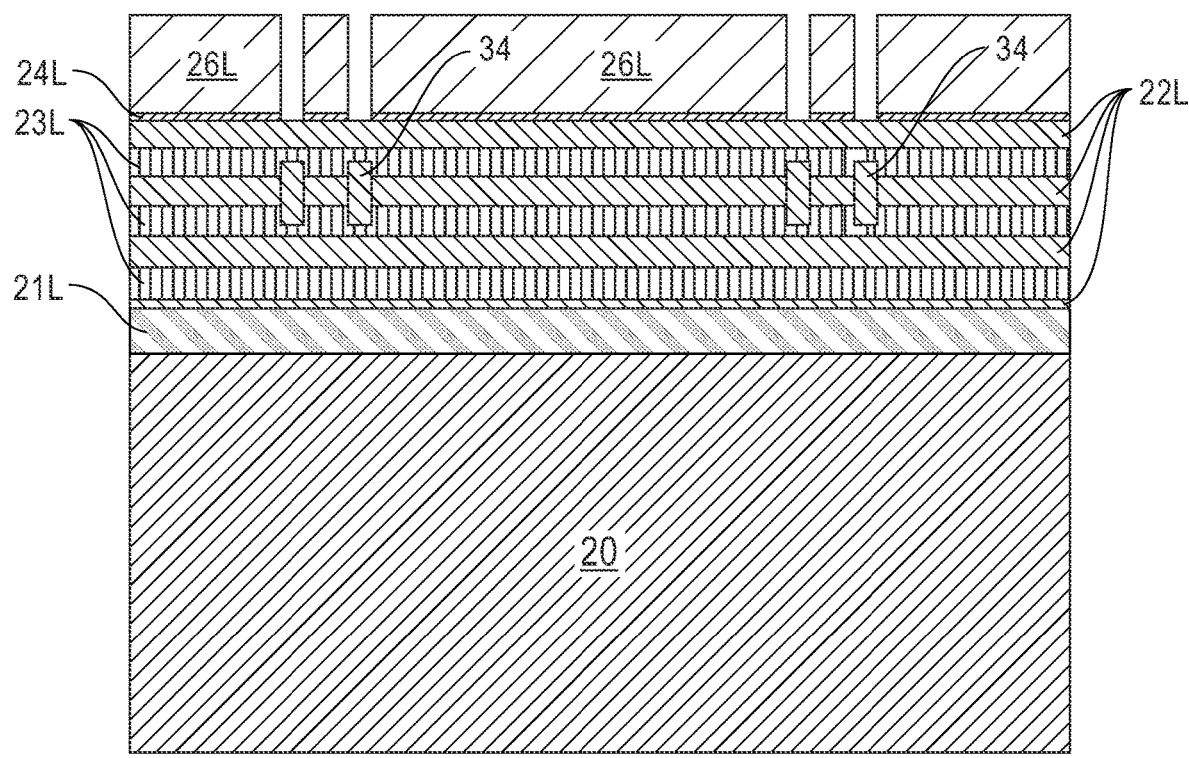
FIG. 19 is a cross sectional view of the exemplary structure shown in FIG. 18 after epitaxially growing sequential layers of semiconductor channel material and sacrificial semiconductor material in each of the through-stack semiconductor channel trench openings to provide a through-stack semiconductor channel material that passes through one of the semiconductor channel material layers and partially into the sacrificial semiconductor channel material layers that are located directly above and beneath the semiconductor channel material layer containing the through-stack semiconductor material.

Referring now to FIG. 19, there is illustrated the exemplary structure shown in FIG. 18 after epitaxially growing sequential layers of semiconductor channel material and sacrificial semiconductor material in each of the through-stack semiconductor channel trench openings 32 to provide a through-stack semiconductor channel material 34 that passes through one of the semiconductor channel material layers 22L and partially into the sacrificial semiconductor channel material layers that are located directly above and beneath the semiconductor channel material layer containing the through-stack semiconductor material 34. In this embodiment, the semiconductor channel material and sacrificial semiconductor material that are sequentially grown typically match the semiconductor material layers of the respectively semiconductor channel material layers 22L and sacrificial semiconductor material layers 23L. In some embodiments, the semiconductor material that is epitaxially grown can be compositionally different from the semiconductor material that provides each of the semiconductor channel materials. In some embodiments, only the semiconductor material that will be used in providing the through-stack semiconductor channel material 34 is compositionally different from the semiconductor channel material layer 22L that it passes therethrough. In this embodiment, and in the region in which the through-stack semiconductor channel material 34 is to be formed the epitaxially grown material can partially extend into the sacrificial semiconductor channel material layers that are located directly above and beneath the semiconductor channel material layer containing the through-stack semiconductor material 34. In this embodiment, an anisotropic epitaxial growth process is used to sequentially grown the semiconductor channel material and sacrificial semiconductor material in each of the through-stack semiconductor channel trench openings 32.

In embodiments, it is possible to form the structure shown in FIG. 19 during the formation of the material stack itself including the formation of the through-stack trench openings 32 and trench opening fill during the epitaxial grown process itself.

Figure 20A:
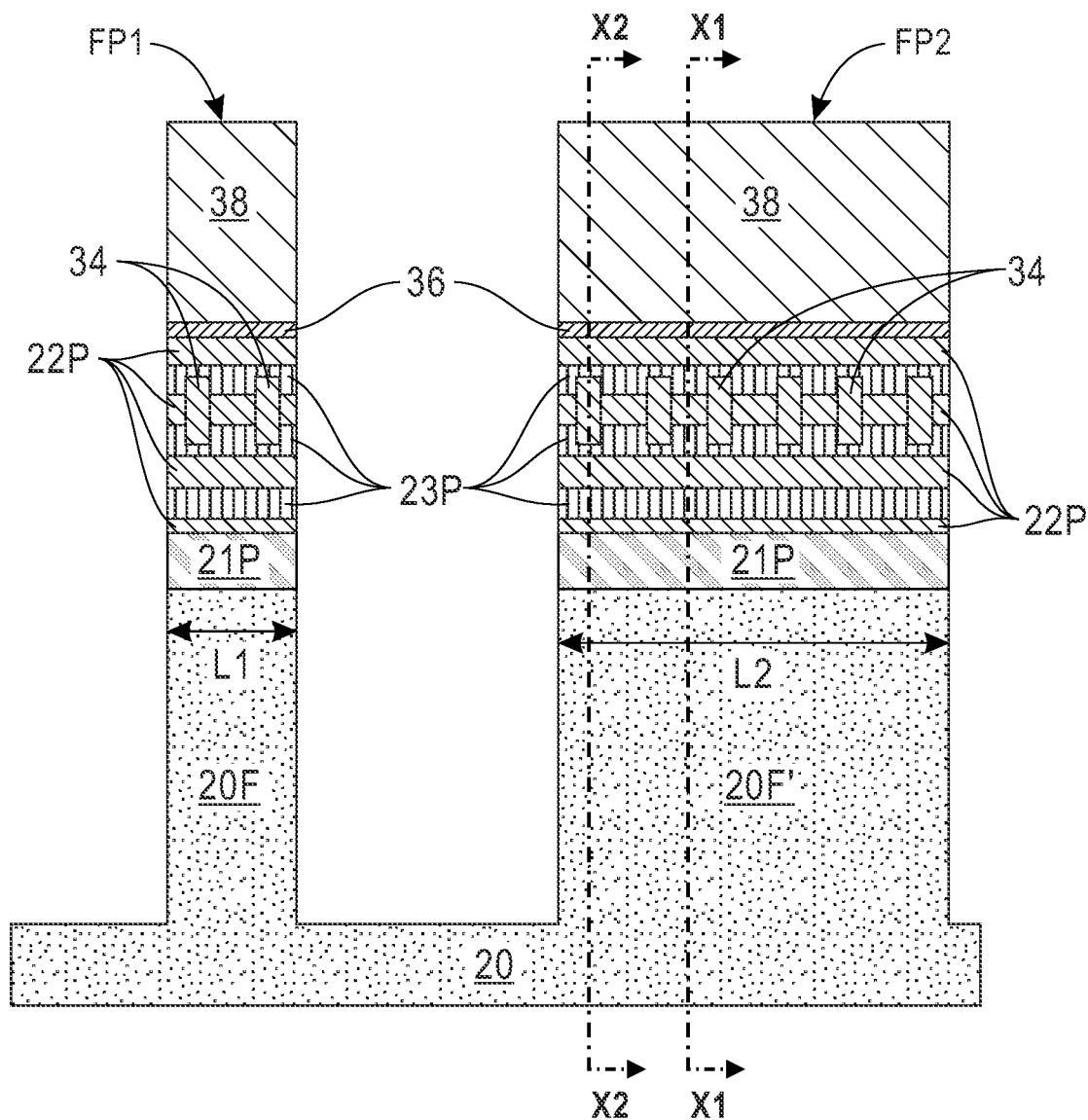
FIG. 20A is a cross sectional view of the exemplary structure similar to the one shown in FIG. 19 after further processing to form a pair of patterned material stacks having different lengths and each containing the through-stack semiconductor channel materials passing through one of the now patterned semiconductor channel material layers.

Referring now to FIG. 20A, there is illustrated the exemplary structure similar to the one shown in FIG. 19 after further processing to form a pair of patterned material stacks 36/38 having different lengths and each containing the through-stack semiconductor channel material 34 passing through one of the now patterned semiconductor channel material layers 22L. See, also, the cross sectional shown in FIGS. 20B and 20C. In this embodiment, the first hard mask layer 26L and the first pad oxide layer 24L are removed as described above in the previous embodiment of the present application. A stack of a second pad oxide layer 36L (this layer is optional in some embodiments of the present application) and a second hard mask layer 38L are then formed as described in the previous embodiment of the present application. This stack is then patterned by lithography and etching to provide a first fin patterned structure FP1 over at least a neighboring pair of through-stack semiconductor channel material 34 and on a portion of the material stack MS, and a second fin patterned structure FP2 over at least a neighboring pair of through-stack semiconductor channel material 34 and on a portion of the material stack MS (in this embodiment FP2 is formed over a plurality of neighboring pair of through-stack semiconductor channel material 34 so as to provide a long channel length semiconductor channel material structure. The patterning includes lithography and etching. The etch removes portions of the second hard mask layer 38L and the second pad oxide layer 36L that are not protected by the developed photoresist material. Each fin patterned structure FP1 and FP 2 includes remaining, i.e., non-etched, portion of the second hard mask layer 38L (hereinafter fin patterned second hard mask 38) and a remaining, non-etched, portion of the second pad oxide layer 36L (hereinafter fin patterned second pad oxide 36).

The pattern provided by each fin patterned structure is then transferred into the material stack and the semiconductor substrate 20 utilizing one or more etching process as previously described above in forming the exemplary structure shown in FIG. 10A. In this embodiment, a first patterned material stack and a first semiconductor fin portion 20F are formed under the first fin patterned structure FP1, and a second patterned material stack and a second semiconductor fin portion 20F' are formed under the second fin patterned structure FP2. In this embodiment, the first patterned material stack and the first semiconductor fin portion 20F have a first length L1, while the second patterned material stack and the second first semiconductor fin portion 20F have a second length L2 that is greater than the first length.

Figure 20B:
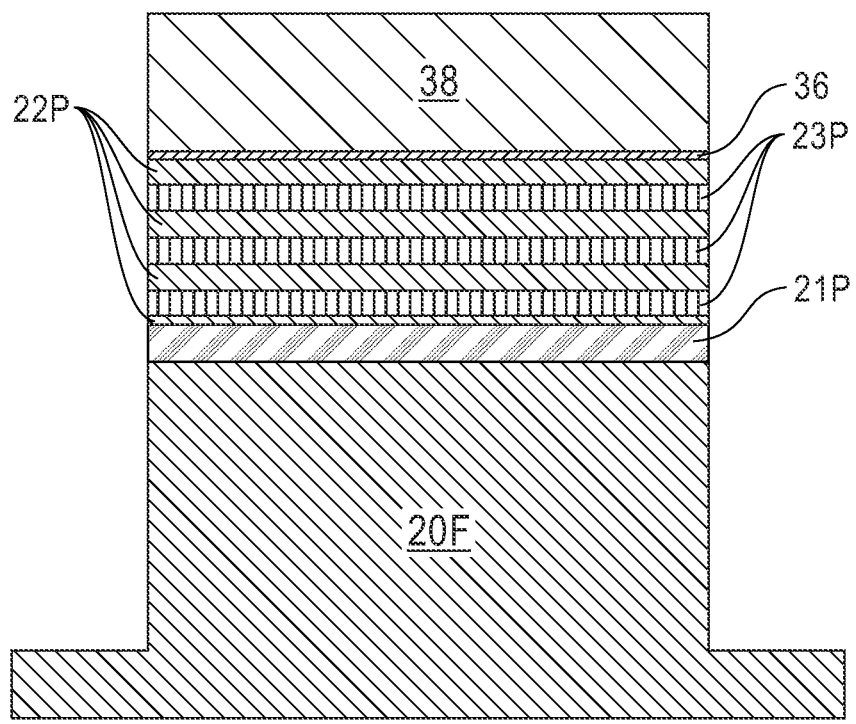
FIG. 20B is a cross sectional view through X1-X1 shown in FIG. 20A; X1-X1 runs into and out of the plane of the drawing and is offset from the center portion of one of the through-stack semiconductor channel materials that is present in the patterned material stack having the larger length.
Figure 20C:
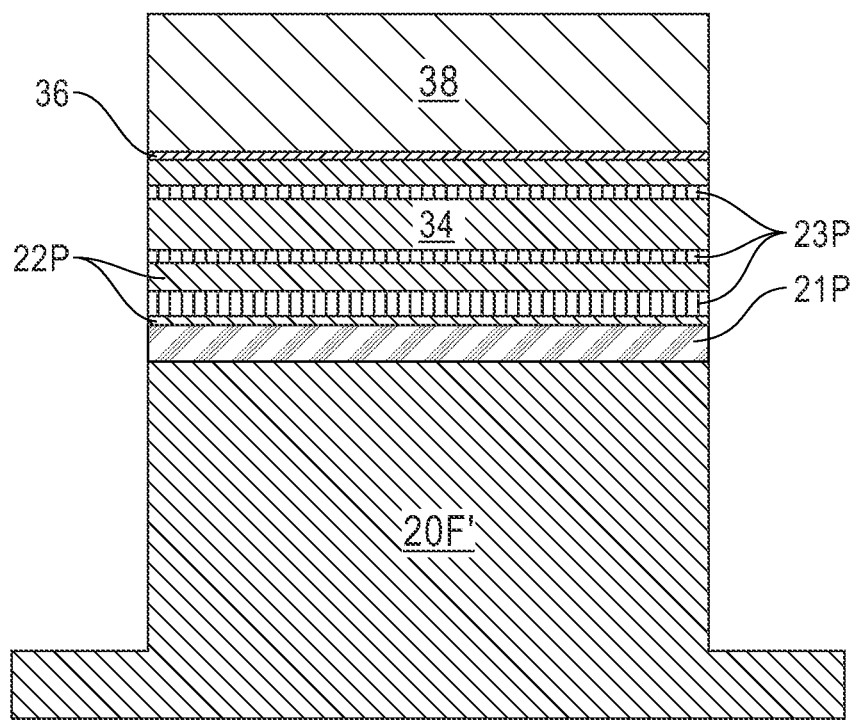
FIG. 20C is a cross sectional view through X2-X2 shown in FIG. 20A; X2-X2 runs into and out of the plane of the drawing and is present in a center portion of one of the through-stack semiconductor channel materials that is present in the patterned material stack having the larger length.
Figure 21A:
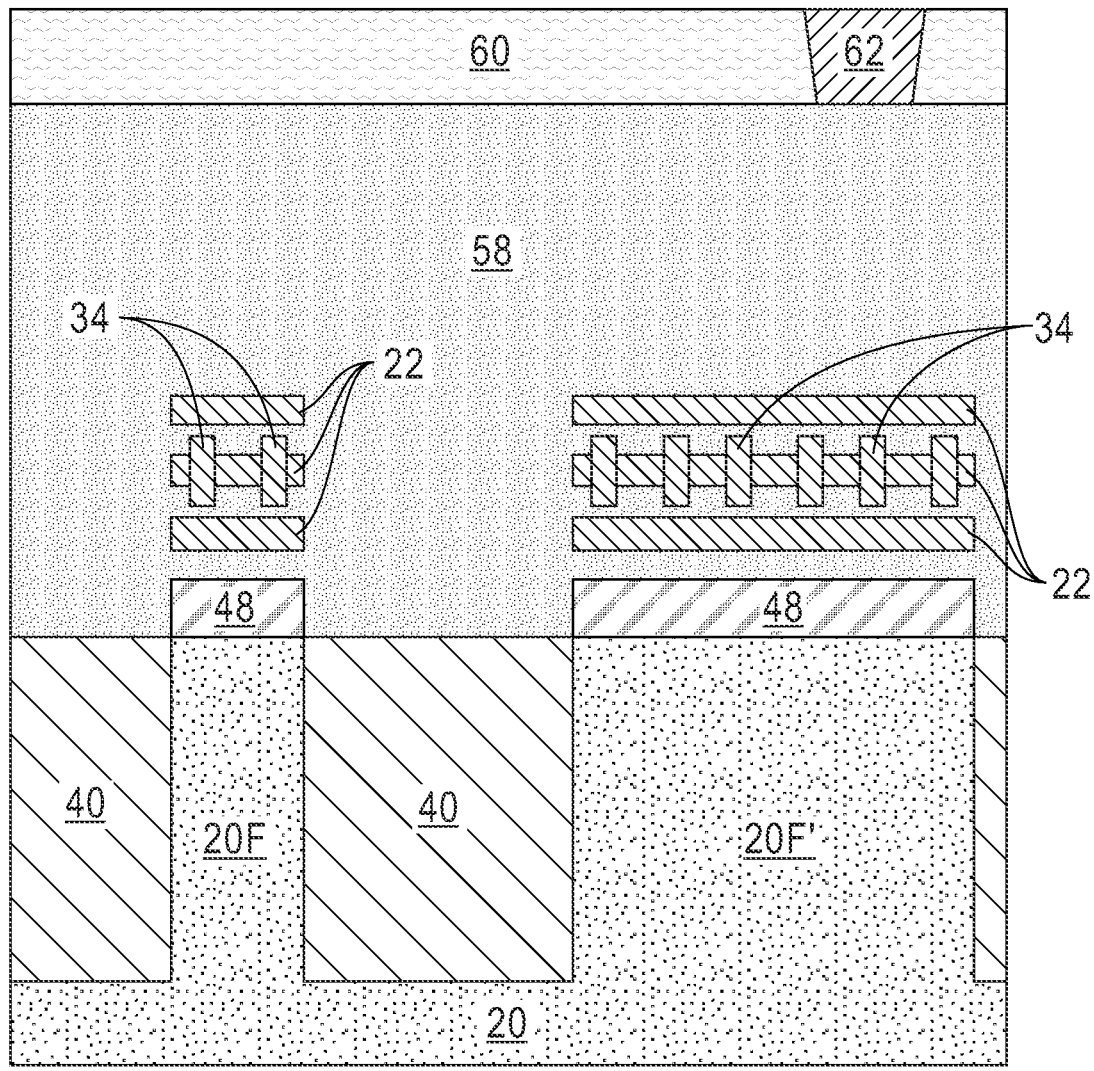
FIGS. 21A, 21B and 21C are cross sectional views of the exemplary structure shown in FIGS. 20A, 20B and 20C, respectively, after further nanosheet device processing which provides a functional gate structure located on each of the semiconductor channel material structures in accordance with the present application.
Figure 21C:
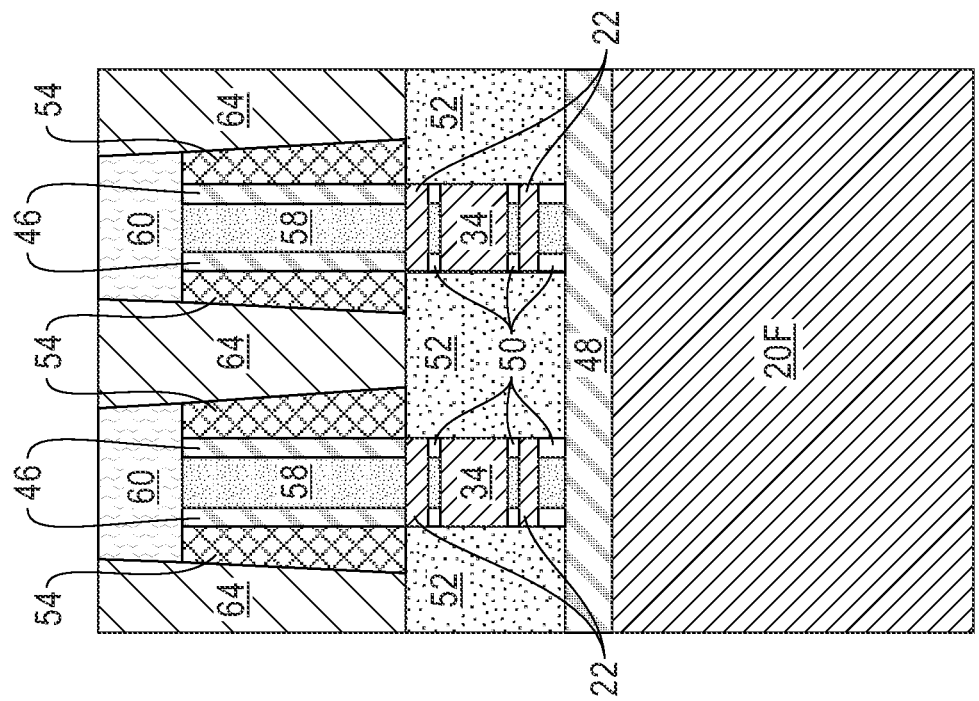
Figure 21B:
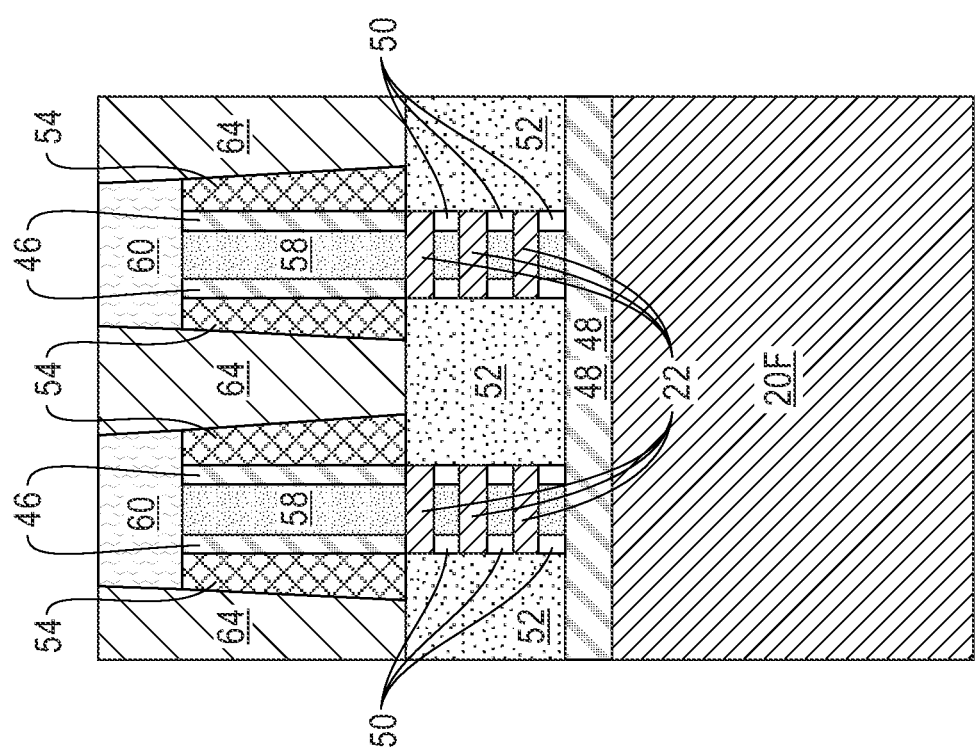

Referring now to FIGS. 21A, 21B and 21C, there are illustrated the exemplary structure shown in FIGS. 20A, 20B and 20C, respectively, after further nanosheet device processing which provides a functional gate structure 58 located on each of the semiconductor channel material structures (22/34) in accordance with the present application. In this exemplary embodiment, a short channel nanosheet device is located on semiconductor channel material structure having a smaller channel width (see the left hand side of the FIG. 21A), and long channel nanosheet device is located on semiconductor channel material structure having the larger channel width (see the right hand side of the FIG. 21A). The further nanosheet device processing includes the processing steps described and illustrated for FIGS. 11A-16C above.

Reference will now be made to FIGS. 22-27C, which illustrate processing steps that can be used in providing a semiconductor structure in accordance with the present application including a functional gate structure formed on physically exposed surfaces of a semiconductor channel material structure in accordance with an embodiment of the present application. In this embodiment, the semiconductor channel material structure that will be formed is the one shown in FIG. 3A. A modification of this processing can be made to provide the semiconductor channel material structures shown in FIG. 3B.

Figure 22:
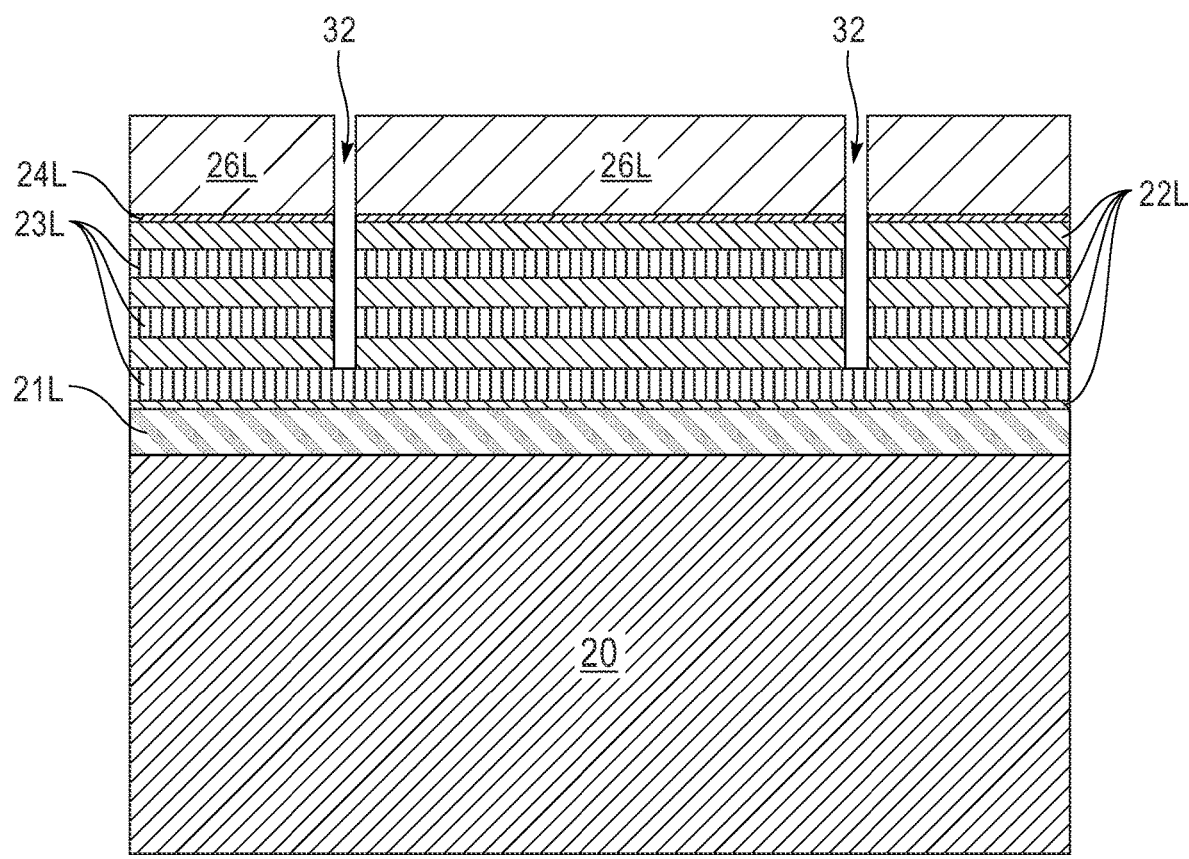
FIG. 22 is a cross sectional view of the exemplary structure shown in FIG. 5 after transferring the at least one trench opening into the first hard mask layer, the first pad oxide layer, and the material stack to provide at least one through-stack trench opening in the exemplary structure, wherein the transferring stops on a surface of the sacrificial semiconductor material layer that is located immediately above the bottommost semiconductor channel material layer.

Referring now to FIG. 22, there is illustrated the exemplary structure shown in FIG. 5 after transferring the at least one trench opening 30 into the first hard mask layer 26L, the first pad oxide layer 24L and the material stack to provide at least one through-stack trench opening 32 in the exemplary structure, wherein the transferring stops on a surface of the sacrificial semiconductor material layer 23L that is located immediately above the bottommost semiconductor channel material layer 22L. The transferring including one or more etching processes as described above for providing the structure shown in FIG. 6 of the present application.

Figure 23:
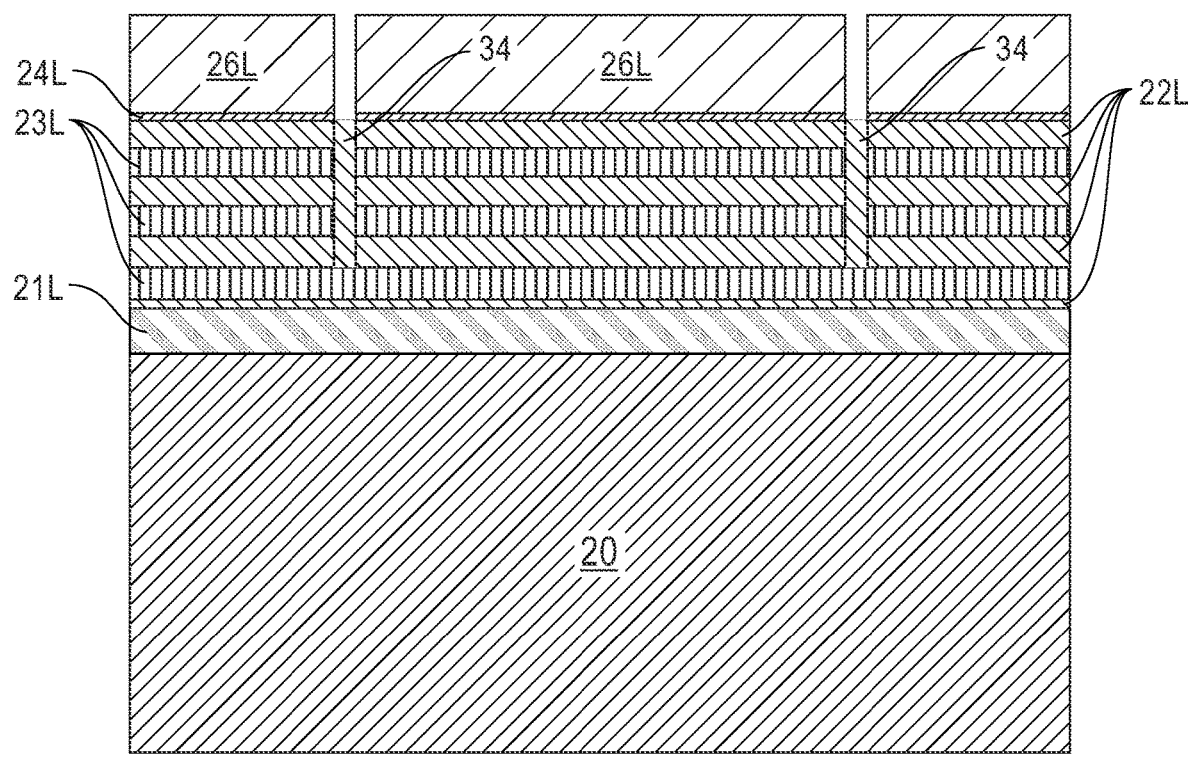
FIG. 23 is a cross sectional view of the exemplary structure shown in FIG. 22 after epitaxially growing a semiconductor channel material in the at least one through-stack semiconductor channel trench to provide a through-stack semiconductor channel material that passes through each of the semiconductor channel material layers expect for the bottommost semiconductor material channel layer.

Referring now to FIG. 23, there is illustrated the exemplary structure shown in FIG. 22 after epitaxially growing a semiconductor channel material in the at least one through-stack semiconductor channel trench 32 to provide a through-stack semiconductor channel material 34 that passes through each of the semiconductor channel material layers 22L expect for the bottommost semiconductor material channel layer 22L. In this embodiment, the epitaxial growth also includes the anisotropic epitaxial growth process mentioned above.

It is again noted that any of the patterning variations or formation of the through-stack semiconductor channel material 34 during the epitaxial growth process of the material stack can be used in providing the exemplary structure shown in FIG. 23.

Figure 24:
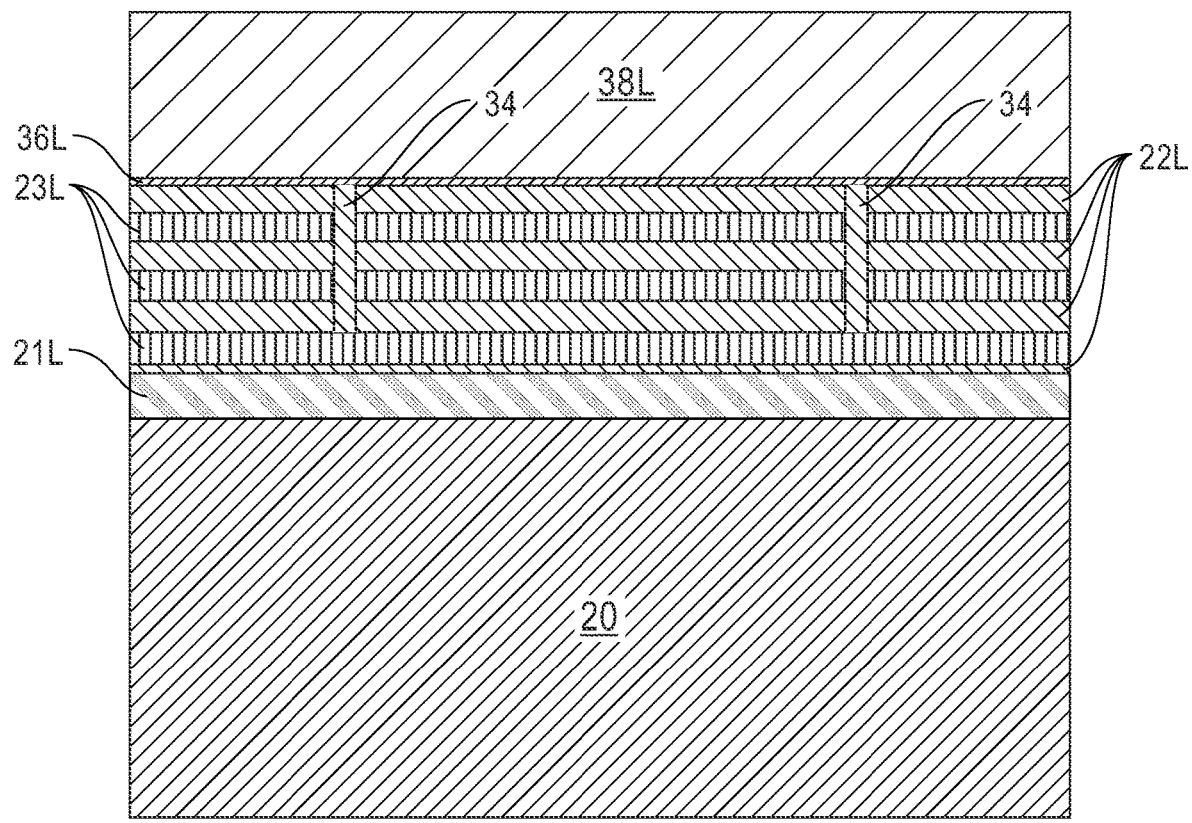
FIG. 24 is a cross sectional view of the exemplary structure shown in FIG. 23 after removing the first hard mask layer and the first pad oxide layer, and forming a second pad oxide layer and a second hard mask layer.

Referring now to FIG. 24, there is illustrated the exemplary structure shown in FIG. 23 after removing the first hard mask layer 26L and the first pad oxide layer 28L, and forming a second pad oxide layer 36L (this layer is optional) and a second hard mask layer 38L. The processing steps and materials mentioned above in forming the exemplary structure shown in FIG. 8 can be used here to provide the exemplary structure shown in FIG. 24.

Figure 25:
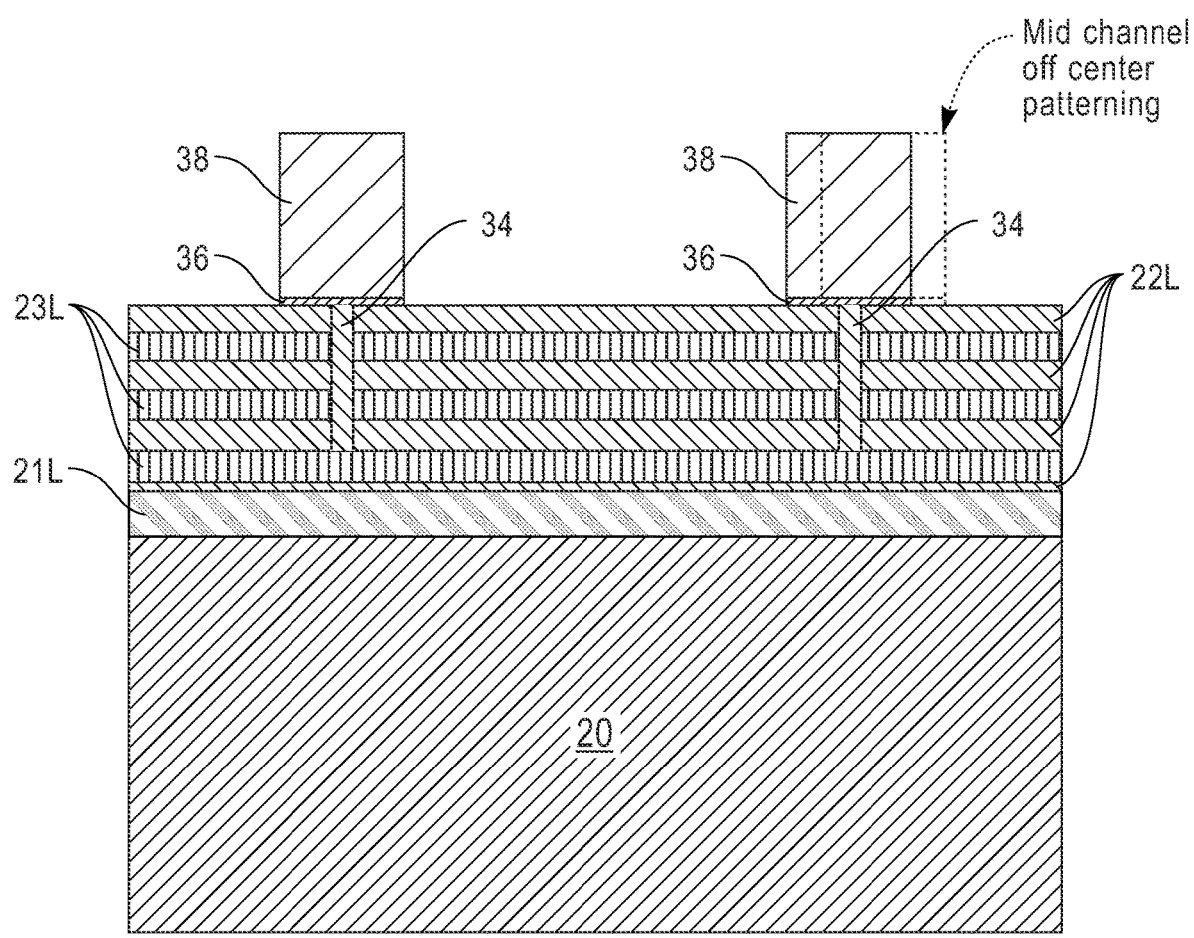
FIG. 25 is a cross sectional view of the exemplary structure shown in FIG. 24 after patterning the second hard mask layer and the second pad oxide layer to provide a fin patterned structure over the through-stack semiconductor channel material.

Referring now to FIG. 25, there is illustrated the exemplary structure shown in FIG. 24 after patterning the second hard mask layer 38L and the second pad oxide layer 26L to provide a fin patterned structure (38/36) over the through-stack semiconductor channel material 34. FIG. 25 shows an embodiment in which the fin patterned structure (including fin patterned second hard mask 38 and fin patterned second pad oxide 36) is located over a center portion of the through-stack semiconductor channel material 34. FIG. 25 also shows via dotted box lines the location of the fin patterned structure that is offset from the center portion of the through-stack semiconductor channel material 34. In this offset embodiment, the semiconductor channel material structure shown in FIG. 3B will be formed. This step of the present application incudes the processing steps mentioned above in providing the exemplary structure shown in FIG. 9.

Figure 26A:
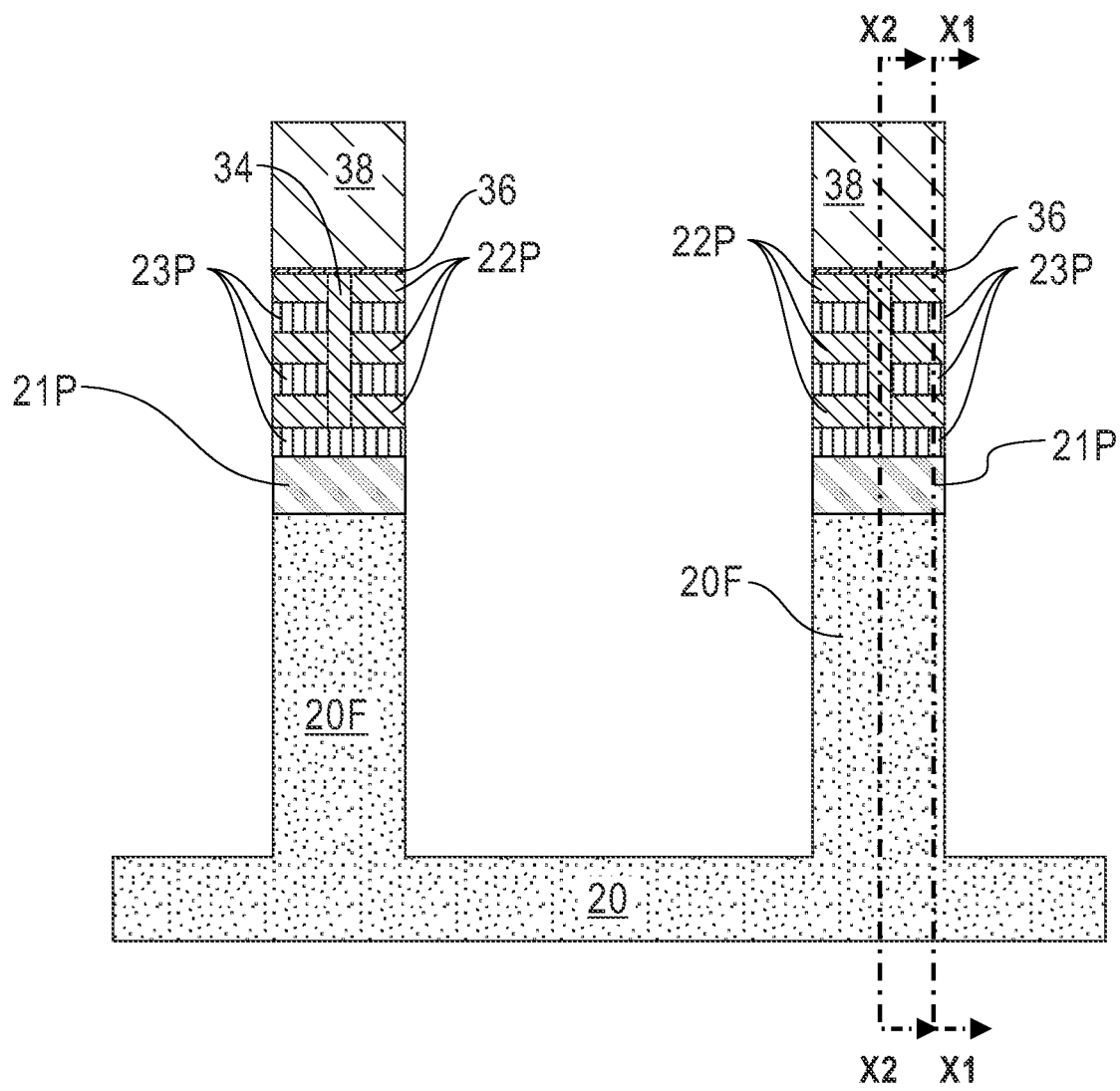
FIG. 26A is a cross sectional view of the exemplary structure shown in FIG. 25 after etching the material stack utilizing the fin patterned structure as an etch mask, wherein the etching stops on a sub-surface of the semiconductor substrate and provides a patterned material stack containing the through-stack semiconductor channel material.

Referring now to FIG. 26A, there is illustrated the exemplary structure shown in FIG. 25 after etching the material stack utilizing the fin patterned structure as an etch mask, wherein the etching stops on a sub-surface of the semiconductor substrate 20 and provides a patterned material stack containing the through-stack semiconductor channel material 34. The processing used in this step of the present application includes the processing mentioned above in forming the exemplary structure shown in FIG. 10A. Also provided are FIGS. 25B and 25C.

Figure 26B:
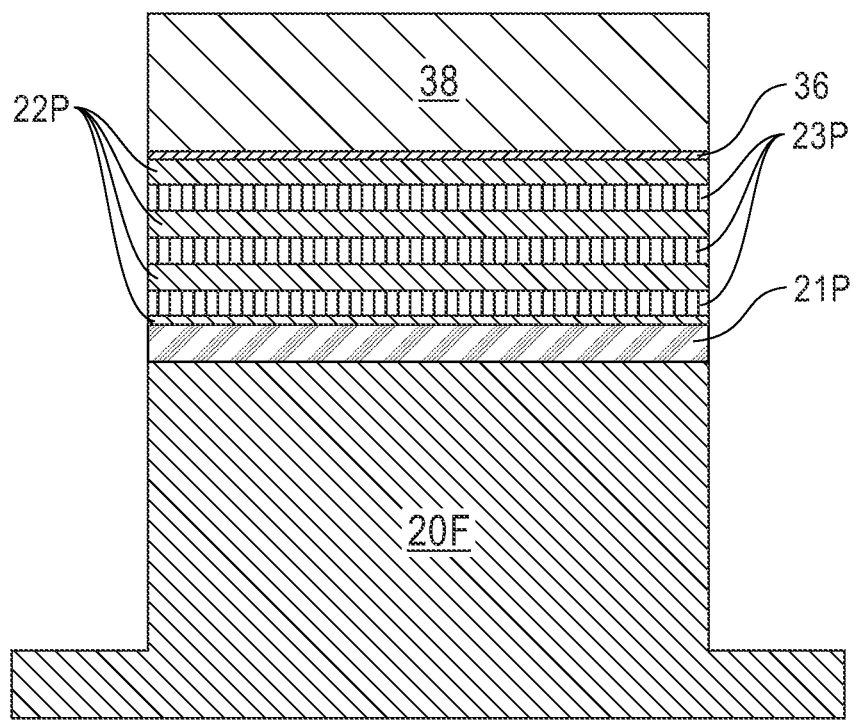
FIG. 26B is a cross sectional view through X1-X1 shown in FIG. 26A; X1-X1 runs into and out of the plane of the drawing and is offset from the center portion of the through-stack semiconductor channel material that is present in the patterned material stack.
Figure 26C:
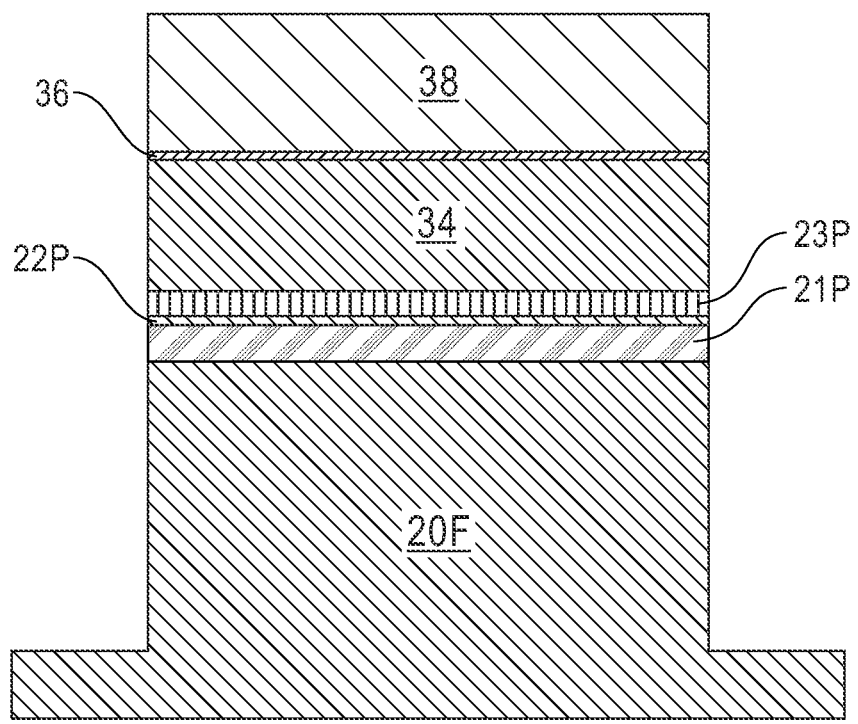
FIG. 26C is a cross sectional view through X2-X2 shown in FIG. 26A; X2-X2 runs into and out of the plane of the drawing and is present in a center portion of the through-stack semiconductor channel material that is present in the patterned material stack.
Figure 27A:
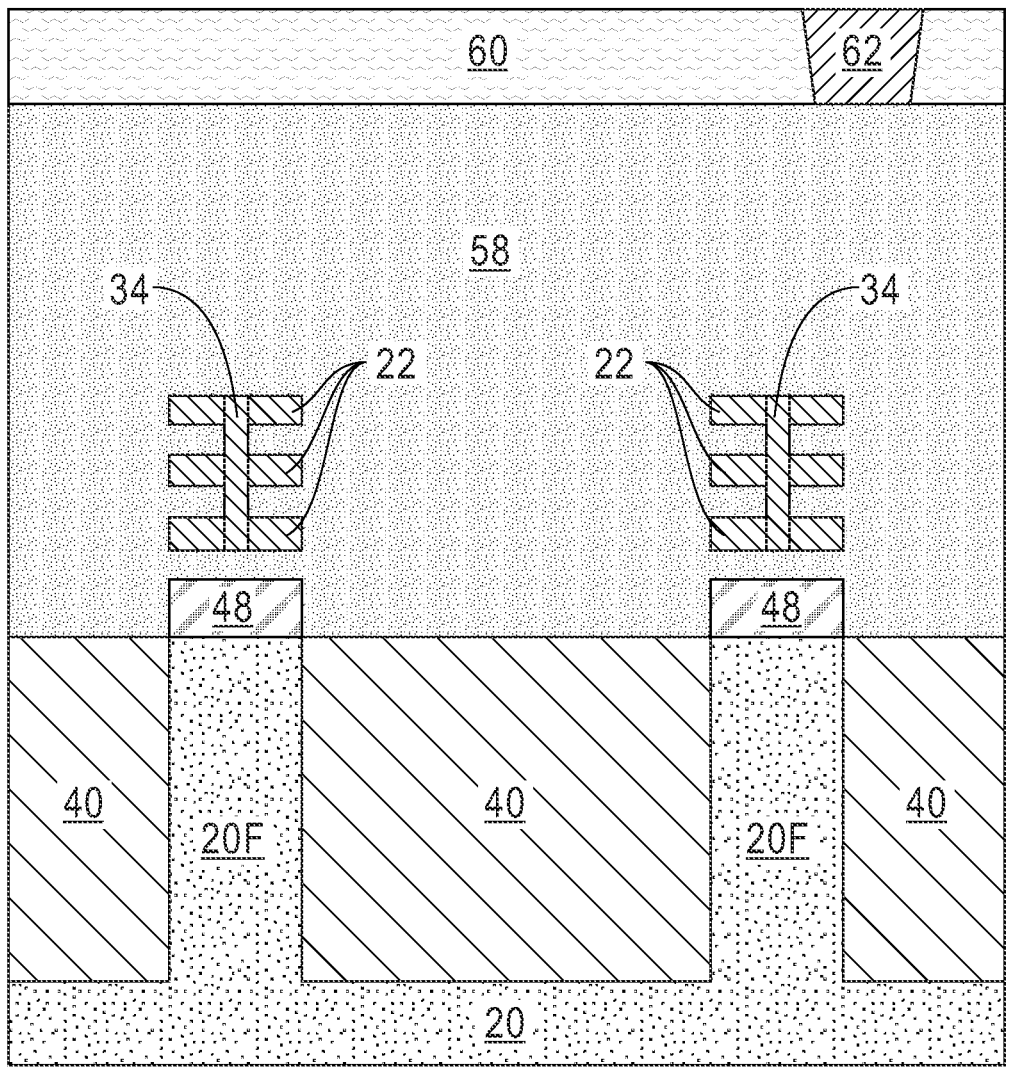
FIGS. 27A, 27B and 27C are cross sectional views of the exemplary structure shown in FIGS. 26A, 26B and 26C, respectively after further nanosheet processing to provide a functional gate structure located on the semiconductor channel material structure in accordance with the present application.
Figure 27C:
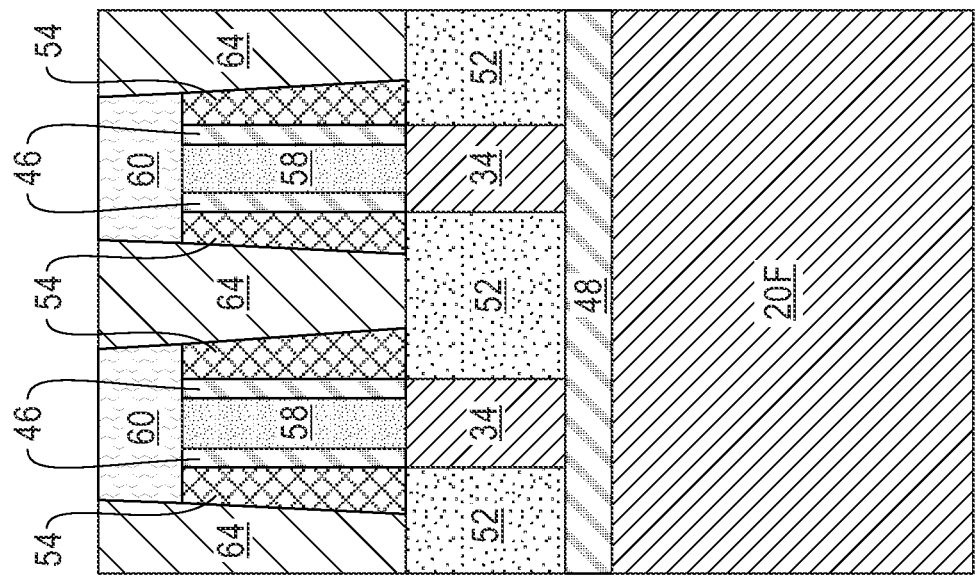
Figure 27B:
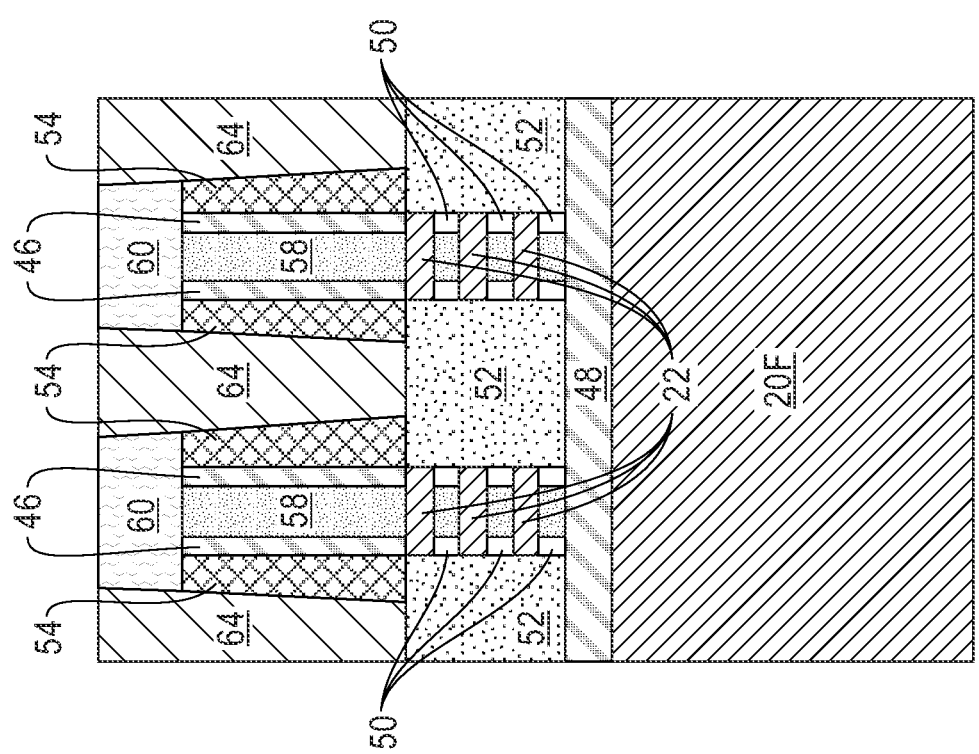

Referring now to FIGS. 27A, 27B and 27C, there are illustrated the exemplary structure shown in FIGS. 26A, 26B and 26C, respectively after further nanosheet processing to provide a functional gate structure 58 located on the semiconductor channel material structure (20/34) in accordance with the present application. The further nanosheet device processing includes the processing steps described and illustrated for FIGS. 11A-16C above.

Due to the presence of the semiconductor channel material structure (22/34) of the present each of the exemplary nanosheet devices have an improved effective channel area as compared to equivalent nanosheet devices that lack the through-stack semiconductor channel material passing through at least one of the semiconductor channel material nanosheets of a vertical stack of suspended semiconductor channel material nanosheets.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a semiconductor channel material structure containing a plurality of semiconductor channel material nanosheets stacked one atop the other and at least one through-stack semiconductor channel material extending through at least one of the semiconductor channel material nanosheets of the plurality of semiconductor channel material nanosheets, wherein the at least one through-stack semiconductor channel material has an upper portion extending through a topmost semiconductor channel material nanosheet of the plurality of semiconductor channel material nanosheets, the upper portion of the at least one through-stack semiconductor channel material has a top and a sidewall, and wherein the top and the sidewall of the at least one through-stack semiconductor channel material are both pyramidal in shape.

2. The semiconductor structure of claim 1, wherein the at least one through-stack semiconductor channel material is oriented perpendicular to each of the semiconductor channel material nanosheets of the plurality of semiconductor channel material nanosheets.

3. The semiconductor structure of claim 1, wherein the at least one through-stack semiconductor channel material extends entirely through each of the semiconductor channel material nanosheets of the plurality of semiconductor channel material nanosheets.

4. The semiconductor structure of claim 1, wherein the at least through-stack semiconductor channel material extends through a topmost semiconductor channel material nanosheet of the plurality of semiconductor channel material nanosheets, but not a bottommost semiconductor channel material nanosheet of the plurality of semiconductor channel material nanosheets.

5. The semiconductor structure of claim 1, wherein the at least one through-stack semiconductor channel material comprises a plurality of through-stack semiconductor channel materials extending through at least one of the semiconductor channel material nanosheets of the stack of semiconductor channel material nanosheets.

6. The semiconductor structure of claim 1, wherein the at least one through-stack semiconductor channel material has a same channel length as the plurality of semiconductor channel material nanosheets, and the at least one through-stack semiconductor channel material has a width that is equal to a distance between each semiconductor channel material nanosheet of the plurality of semiconductor channel material nanosheets.

7. The semiconductor structure of claim 6, wherein the at least one through-stack semiconductor channel material is located at a center of a channel width of the at least one of the semiconductor channel material nanosheets of the plurality of semiconductor channel material nanosheets.

8. The semiconductor structure of claim 6, wherein the at least one through-stack semiconductor channel material is offset from a center of a channel width of the at least one of the semiconductor channel material nanosheets of the plurality of semiconductor channel material nanosheets.

9. The semiconductor structure of claim 1, wherein the at least one through-stack semiconductor channel material is composed of a semiconductor material that is compositionally the same as a semiconductor material that provides each of the semiconductor channel material nanosheet of the plurality of semiconductor channel material nanosheets.

10. The semiconductor structure of claim 1, wherein the at least one through-stack semiconductor channel material is composed of a semiconductor material that is compositionally different from a semiconductor material that provides each of the semiconductor channel material nanosheet of the plurality of semiconductor channel material nanosheets.

11. The semiconductor structure of claim 1, further comprising a functional gate structure contacting physically exposed surface of the semiconductor channel material structure.

12. The semiconductor structure of claim 1, further comprising another semiconductor channel material structure located laterally adjacent to the semiconductor channel material structure, wherein the another semiconductor channel material structure contains a plurality of other semiconductor channel material nanosheets stacked one atop the other and a plurality of other through-stack semiconductor channel material extending through one of the other semiconductor channel material nanosheets of the plurality of other semiconductor channel material nanosheets, wherein the semiconductor channel material structure and the another semiconductor channel material structure have different channel lengths.

* * * * *